US011284187B1

(12) United States Patent
Huang et al.

(10) Patent No.: US 11,284,187 B1
(45) Date of Patent: Mar. 22, 2022

(54) SMALL-ARRAY MEMS MICROPHONE APPARATUS AND NOISE SUPPRESSION METHOD THEREOF

(71) Applicant: Fortemedia, Inc., Santa Clara, CA (US)

(72) Inventors: Yen-Son Paul Huang, Los Altos Hills, CA (US); Tsung-Lung Yang, Hsinchu (TW)

(73) Assignee: FORTEMEDIA, INC., Santa Clara, CA (US)

( * ) Notice: Subject to any disclaimer, the term of this patent is extended or adjusted under 35 U.S.C. 154(b) by 31 days.

(21) Appl. No.: 17/079,777

(22) Filed: Oct. 26, 2020

(51) Int. Cl.
*H04R 1/00* (2006.01)
*H04R 1/34* (2006.01)
*B81C 1/00* (2006.01)
*H04R 1/02* (2006.01)

(52) U.S. Cl.
CPC ......... *H04R 1/342* (2013.01); *B81C 1/00182* (2013.01); *H04R 1/02* (2013.01); *B81B 2201/0257* (2013.01); *H04R 2201/003* (2013.01)

(58) Field of Classification Search
CPC .... H04R 1/342; H04R 1/02; H04R 2201/003; H04R 19/005; H04R 1/04; H04R 1/06; B81C 1/00182; B81C 1/0023; B81C 2203/0154; B81B 2201/0257; B81B 2201/0264; H01L 2924/1461; H01L 2224/48227
See application file for complete search history.

(56) References Cited

U.S. PATENT DOCUMENTS

| 8,170,244 | B2 * | 5/2012 | Ryan | H04R 1/406 381/174 |
| 8,804,982 | B2 * | 8/2014 | Michel | H04R 1/406 381/111 |
| 9,202,475 | B2 * | 12/2015 | Elko | G10K 11/16 |
| 10,349,172 | B1 * | 7/2019 | Huang | H04R 19/04 |
| 10,597,287 | B2 * | 3/2020 | Ghidoni | B81B 7/0061 |
| 2008/0037768 | A1 * | 2/2008 | Hsu | H05K 1/181 379/429 |
| 2010/0226507 | A1 * | 9/2010 | Horibe | H04R 1/406 381/92 |

(Continued)

*Primary Examiner* — Matthew A Eason
(74) *Attorney, Agent, or Firm* — McClure, Qualey & Rodack, LLP

(57) ABSTRACT

A small-array MEMS (micro-electro mechanical system) microphone apparatus is provided. The apparatus includes first and second microphone modules. A first microphone of the first microphone module captures a first acoustic signal from a sound source through a first acoustic hole. A second microphone of the second microphone module captures a second acoustic signal from the sound source through a second acoustic hole. A first integrated circuit performs a first logic operation on the first acoustic signal and the second acoustic signal to generate a first sum acoustic signal. The first integrated circuit performs a sampling delay on the second acoustic signal with a first clock signal, and subtracts the delayed second acoustic signal from the first acoustic signal to obtain a first differential acoustic signal. The first differential acoustic signal has a first directivity. A second integrated circuit bypasses and outputs the second acoustic signal which is omnidirectional.

18 Claims, 18 Drawing Sheets

(56) References Cited

U.S. PATENT DOCUMENTS

| | | | |
|---|---|---|---|
| 2010/0303273 A1* | 12/2010 | Sawada | H04R 1/406 |
| | | | 381/361 |
| 2011/0317023 A1* | 12/2011 | Tsuda | H04R 1/406 |
| | | | 348/207.99 |
| 2012/0328142 A1* | 12/2012 | Horibe | H04R 1/406 |
| | | | 381/355 |
| 2014/0233756 A1* | 8/2014 | Inoda | H04R 1/02 |
| | | | 381/91 |
| 2014/0348370 A1* | 11/2014 | Huang | H04R 1/02 |
| | | | 381/361 |
| 2016/0345106 A1* | 11/2016 | Pahl | H04R 19/04 |
| 2017/0013355 A1* | 1/2017 | Kim | H04R 19/005 |
| 2021/0136487 A1* | 5/2021 | Shumard | H04R 3/005 |

\* cited by examiner

SMALL-ARRAY MEMS MICROPHONE APPARATUS AND NOISE SUPPRESSION METHOD THEREOF

BACKGROUND OF THE INVENTION

Field of the Invention

The present invention relates in general to microphone apparatuses, and, in particular, to a small-array MEMS (micro-electro mechanical system) microphone apparatus and a noise-suppression method thereof.

Description of the Related Art

Currently, most microphone apparatuses are capacitive microphones in which MEMS microphones are widely used. A MEMS microphone uses MEMS, in which electronic, electrical, and mechanical functions are integrated into a single device. Therefore, a MEMS microphone may have the advantages of a small size, low power consumption, easy packaging, and resistance to interference.

In general, a microphone apparatus having multiple microphones (such as a MEMS microphone) can perform better due to its higher sensitivity and better noise-to-signal ratio. However, if omnidirectional microphones are disposed in a microphone array, the acoustic signal output by the microphone array often has poor directivity, so it is easy to provide an acoustic signal with more noise to the back-end speech-recognition device, thereby lowering the recognition rate of the speech.

Accordingly, there is demand for a small-array MEMS microphone apparatus and a noise-suppression method to solve the aforementioned problem.

BRIEF SUMMARY OF THE INVENTION

In an exemplary embodiment, a small-array MEMS (micro-electro mechanical system) microphone apparatus is provided. The small-array MEMS microphone apparatus includes a microphone cover, a circuit board, a first microphone module, and a second microphone module. The circuit board is coupled to the microphone cover, and includes a first acoustic hole and a second acoustic hole. The first microphone module includes a first microphone and a first integrated circuit. The first microphone captures a first acoustic signal from a sound source through the first acoustic hole. The second microphone module includes a second microphone and a second integrated circuit. The second microphone captures a second acoustic signal from the sound source through the second acoustic hole. The first microphone and the second microphone have the same sensitivity, phase, and omni-directivity. The first integrated circuit performs a first logic operation on the first acoustic signal and the second acoustic signal to generate a first sum acoustic signal. The first integrated circuit performs a sampling delay on the second acoustic signal with a first clock signal, and subtracts the delayed second acoustic signal from the first acoustic signal to obtain a first differential acoustic signal, wherein the first differential acoustic signal has a first directivity. The second integrated circuit bypasses and outputs the second acoustic signal, and the second acoustic signal is omnidirectional.

In some embodiments, the first integrated circuit and the second integrated circuits are application-specific integrated circuits, and a frequency of the first clock signal is 2.048 MHz. In addition, a first distance between the first microphone and the second microphone is 5 mm.

In some embodiments, the first integrated circuit applies a low-pass filter and a first equalizer on the first sum acoustic signal to obtain a first low-frequency acoustic signal, applies a band-pass filter and a second equalizer to obtain a first intermediate-frequency acoustic signal, and applies a high-pass filter and a third equalizer on the second acoustic signal to obtain a first high-frequency acoustic signal. The first low-frequency acoustic signal, the first intermediate-frequency acoustic signal, and the first high-frequency acoustic signal all have substantially the same sensitivity. In addition, a first pass band of the low-pass filter is 200 Hz or less, a second pass band of the band-pass filter is from 200 to 7400 Hz, and a third pass band of the high-pass filter is 7400 Hz or above.

In some embodiments, the first integrated circuit adds the first low-frequency acoustic signal, the first intermediate-frequency acoustic signal, and the first high-frequency acoustic signal to generate a first beam, and the first beam has the first directivity.

In some embodiments, the first acoustic signal is input into the second integrated circuit, and the second integrated circuit performs a sampling delay on the first acoustic signal with the first clock signal, and subtracts the delayed first acoustic signal from the second acoustic signal to obtain a second differential acoustic signal, and the second differential acoustic signal has a second directivity, wherein the second directivity is different from the first directivity. The second integrated circuit applies the low-pass filter and the first equalizer on the first sum acoustic signal to obtain a second low-frequency acoustic signal, applies the band-pass filter and the second equalizer on the first differential acoustic signal to obtain a second intermediate-frequency acoustic signal, and applies the high-pass filter and the third equalizer on the second acoustic signal to obtain a second high-frequency acoustic signal. The second integrated circuit adds the second low-frequency acoustic signal, the second intermediate-frequency acoustic signal, and the second high-frequency acoustic signal to generate a second beam, and the second beam has the second directivity.

In some embodiments, A noise-suppression method, for use in a small-array MEMS (micro-electro mechanical system) microphone apparatus, wherein the small-array MEMS microphone apparatus comprises a microphone cover; a circuit board, a first microphone module, and a second microphone module, and the first microphone module comprises a first microphone and a first integrated circuit, and the second microphone module comprises a second microphone and a second integrated circuit, wherein the first microphone and the second microphone have the same sensitivity, phase, and omni-directivity. The method includes the following steps: capturing a first acoustic signal and a second acoustic signal from a sound source by the first microphone and the second microphone, respectively; performing, by the first integrated circuit, a first logic operation on the first acoustic signal and the second acoustic signal to generate a first sum acoustic signal; sampling and delaying the second acoustic signal with a first clock signal by the first integrated circuit, and subtracting the delayed second acoustic signal from the first acoustic signal to obtain a first differential acoustic signal which has a first directivity; and bypassing and outputting, by the second integrated circuit, the second acoustic signal, wherein the second acoustic signal is omnidirectional.

In yet another exemplary embodiment, a small-array MEMS (micro-electro mechanical system) microphone apparatus is provided. The small-array MEMS microphone apparatus includes a microphone cover, a circuit board, a first microphone module, a second microphone module, and a third microphone module. The circuit board is coupled to the microphone cover, and includes a first acoustic hole, a second acoustic hole, and a third acoustic hole. The first microphone module includes a first microphone and a first integrated circuit, wherein the first microphone captures a first acoustic signal from a sound source through the first acoustic hole. The second microphone module includes a second microphone and a second integrated circuit, wherein the second microphone captures a second acoustic signal from the sound source through the second acoustic hole. The third microphone module comprises a third microphone and a third integrated circuit. The third microphone captures a third acoustic signal from the sound source through the third acoustic hole. The first microphone, the second microphone, and the third microphone have the same sensitivity, phase, and omni-directivity. The first acoustic signal is input into the second integrated circuit. The second acoustic signal is input into the third integrated circuit. The third acoustic signal is input into the first integrated circuit. The first integrated circuit performs a first logic operation on the first acoustic signal and the third acoustic signal to generate a first sum acoustic signal, and performs a sampling delay on the third acoustic signal with a first clock signal, and subtracts the delayed third acoustic signal from the first acoustic signal to obtain a first differential acoustic signal, wherein the first differential acoustic signal has a first directivity. The first integrated circuit bypasses and outputs the first acoustic signal, wherein the first acoustic signal is omnidirectional. The second integrated circuit performs a second logic operation on the second acoustic signal and the first acoustic signal to generate a first sum acoustic signal, performs sampling delay on the first acoustic signal with the first clock signal, and subtracts the delayed first acoustic signal from the second acoustic signal to obtain a second differential acoustic signal, wherein the second differential acoustic signal has a second directivity. The second integrated circuit bypasses and outputs the second acoustic signal, wherein the second acoustic signal is omnidirectional. The third integrated circuit performs a third logic operation on the third acoustic signal and the second acoustic signal to generate a third sum acoustic signal, performs sampling delay on the second acoustic signal with the first clock signal, and subtracts the delayed second acoustic signal from the third acoustic signal to obtain a third differential acoustic signal, wherein the third differential acoustic signal has a third directivity. The third integrated circuit bypasses and outputs the third acoustic signal, wherein the third acoustic signal is omnidirectional.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

It must be understood that the words "including", "including" and other words used in this specification are used to indicate the existence of specific technical features, values, method steps, operations, elements and/or components, but not It is not excluded that more technical features, values, method steps, job processing, elements, components, or any combination of the above can be added.

Figure 1A:
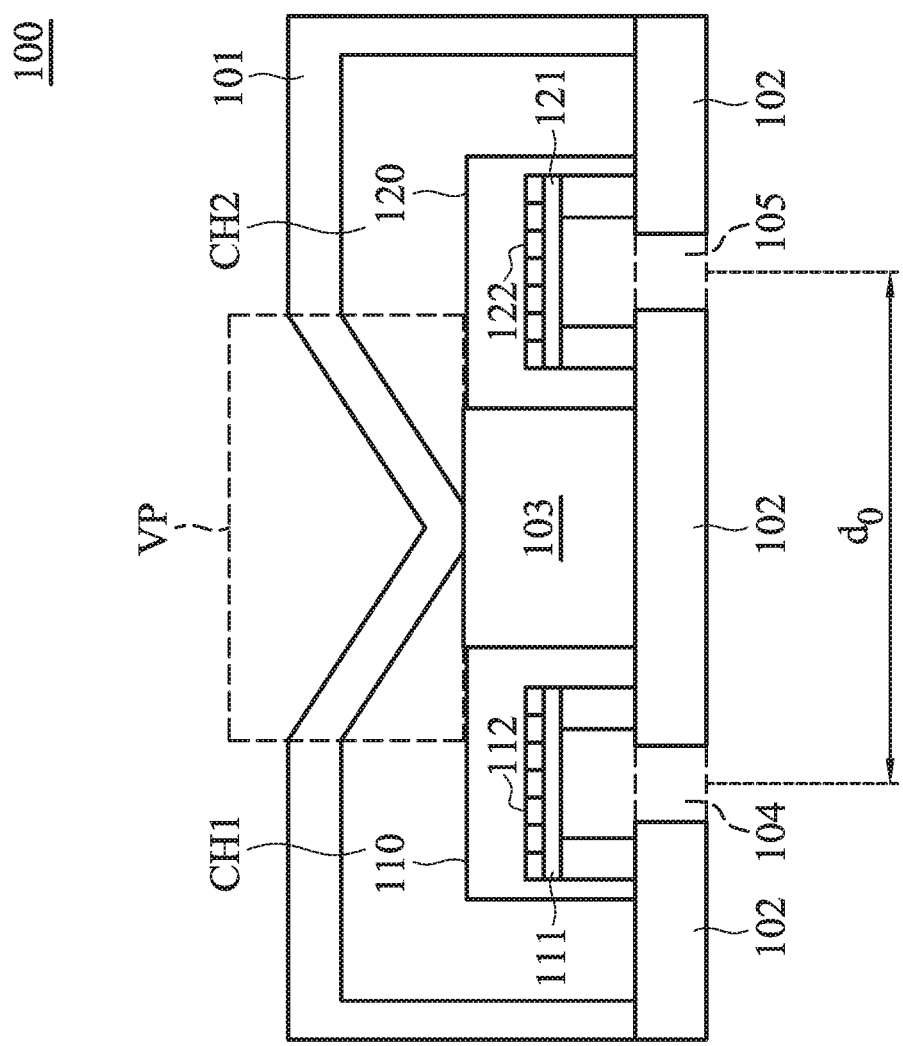
FIG. 1A is a schematic diagram of a small-array MEMS microphone apparatus in accordance with an embodiment of the invention.
Figure 1B:
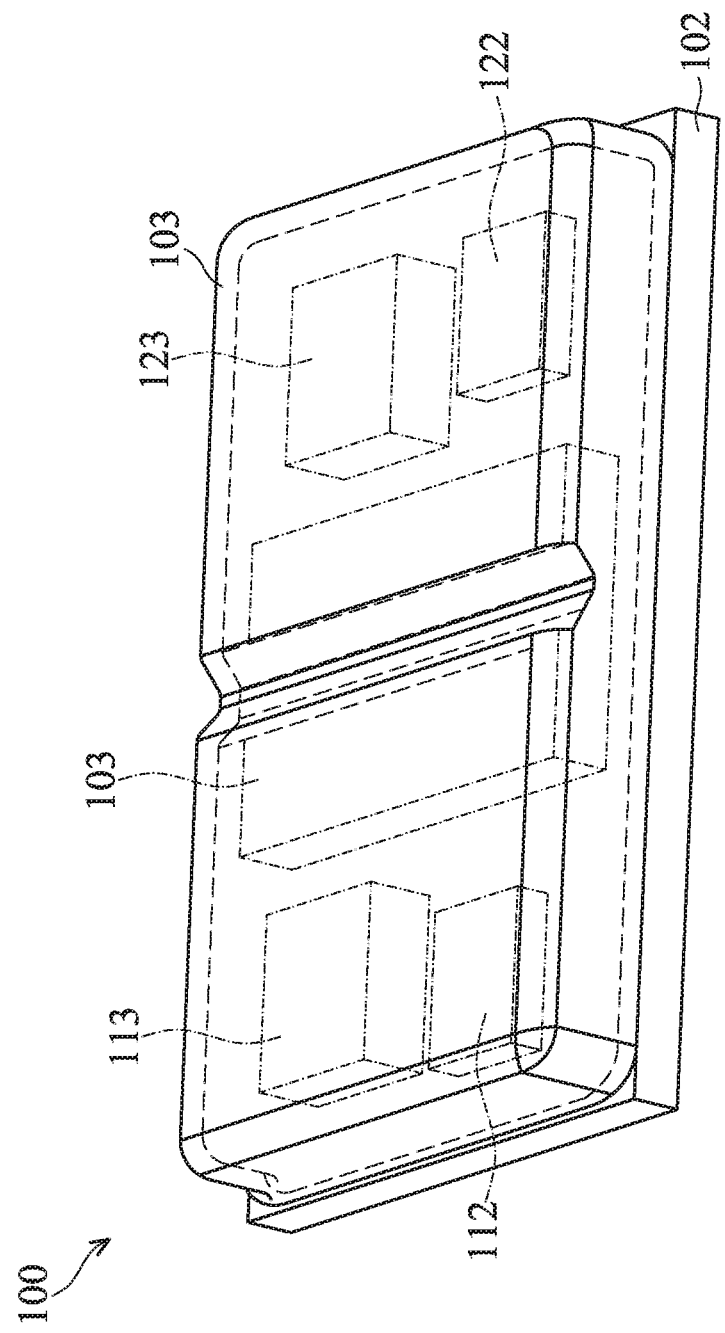
FIG. 1B is a perspective view of the small-array MEMS microphone apparatus in accordance with the embodiment of FIG. 1A.

FIG. 1A is a schematic diagram of a small-array MEMS microphone apparatus in accordance with an embodiment of the invention. FIG. 1B is a perspective view of the small-array MEMS microphone apparatus in accordance with the embodiment of FIG. 1A. Referring to FIG. 1A and FIG. 1B, the small-array MEMS microphone apparatus 100 (abbreviated as the "microphone apparatus 100" hereafter) includes a microphone cover 101, a circuit board 102, a processor, and microphone modules 110 and 120. The processor 103 is coupled to the microphone cover 101 and the circuit board 102 to form the chamber CH1 and chamber CH2. The microphone 110 in the chamber CH1 includes diaphragm 111. The microphone 120 in the chamber CH2 includes diaphragm 121. The circuit board 102 is coupled to the microphone cover 101 and includes acoustic holes 104 and 105, and the distance between the acoustic holes 104 and 105 is d0 (e.g., 5 mm, but not limited to this). The acoustic holes 104 and 105 of the microphone apparatus 100 may be located on the same plane, and may receive an acoustic signal respectively via the diaphragm 111 and 121. In some embodiments, the distance d0 may be the distance between the central points of the acoustic holes 104 and 105, and may be regarded as the distance between the microphones 112 and 122.

In some embodiments, the processor 103 may be a digital signal processor (DSP) or a microcontroller, but the invention is not limited thereto. The microphones 112 and 122 are MEMS devices that form a microphone array. In some embodiments, the integrated circuits 113 and 123 may be application-specific integrated circuits which include a digital circuit (e.g., the circuit which can perform digital-signal-processing (DSP)), an analog circuit (e.g., operational amplifier), and an analog-to-digital convertor, and the details will be described later.

In some embodiments, the integrated circuits 113 and 123 are respectively connected to the microphones 112 and 122 and are capable of controlling the microphones 112 and 122. In some embodiments, the integrated circuits 113 and 123 are connected to the circuit board 102 via a conductor (or conductive wires), and coupled to the microphones 110 and 120 via other conductors (or conductive wires), thereby providing voltages to the microphones 112 and 122 and processing signals (generated by the sound) received from the microphones 112 and 122. In some embodiments, the integrated circuits 113 and 123 on the circuit board 102 may use the pulse-density modulation (PDM) protocol for data transmission.

In some embodiments, the material of the microphone cover 101 is metal that forms the groove VP on the microphone cover 101. On the other hand, if the material of the microphone cover 101 is metal, the thickness of the microphone cover 101 can be reduced and still have enough rigidity, which reduces the size of the microphone apparatus 100.

In some embodiments, the chambers CH1 and CH2 are the same size. Furthermore, the arrangement of the microphone module 110 in the chamber CH1 is the same as the arrangement of the microphone module 120 in the chamber CH2. In such cases, the environment corresponding to the microphone module 110 is substantially the same as the environment corresponding to the microphone module 120. Therefore, when the integrated circuits 113 and 123 process the signal received from the microphones 112 and 122 and performs a function related to the directivity of the microphone apparatus 100, the effects caused by the difference between the environment of the microphone 110 and the environment of the microphone 120 can be reduced, which improves the accuracy of the directivity of the microphone apparatus 100.

In some embodiments, the integrated circuits 113 and 123 may provide the same voltage to the microphones 112 and 122, which makes the distance between the diaphragm 111 and the back-plate (not shown in FIG. 1) of the microphone 112 the same as the distance between the diaphragm 121 and the back-plate (not shown in FIG. 1) of the microphone 122. In such cases, the sensitivity of the microphone 110 is the same as the sensitivity of the microphone 120, which improves the SNR of the microphone apparatus 100.

As shown in FIG. 1A, the acoustic hole 104 corresponds to the position of the diaphragm 111, and the diaphragm 111 can receive sound through the acoustic hole 104. The acoustic hole 105 corresponds to the position of the diaphragm 121, and the diaphragm 121 can receive sound through the acoustic hole 105. In some embodiments, the first sound wave transmitted from outside the microphone apparatus 100 may be transmitted to the microphones 112 and 122 through the respective acoustic holes 104 and 105. Based on the distance do between the acoustic holes 104 and 105, a first part and a second part of the first sound wave may respectively reach the diaphragm 111 and diaphragm 121 at the same time if the first sound wave is transmitted in a specific direction, which makes the microphone apparatus 100 perform directivity. In some embodiments, the distance d0 may be the distance between the central points of acoustic holes 104 and 105, and it may be regarded as the distance between microphones 112 and 122.

In some embodiments, the sound wave propagated from the acoustic hole 104 to the diaphragm 111 (e.g., the first part of the first sound wave) is not transmitted to the diaphragm 121, and the sound wave propagated from the acoustic hole 105 to the diaphragm 121 (e.g., the second part of the first sound wave) is not transmitted to the diaphragm 111. In such cases, the microphone 112 of the chamber CH1 is not interrupted by the sound wave transmitted to the microphone 122 of the chamber CH2. Similarly, the microphone 122 of the chamber CH2 is not interrupted by the sound wave transmitted to the microphone 112 of the chamber CH1. Accordingly, the noise respectively received by the microphones 112 and 122 is reduced, and the performance of the directivity of the microphone apparatus 100 is improved.

Figure 1C:
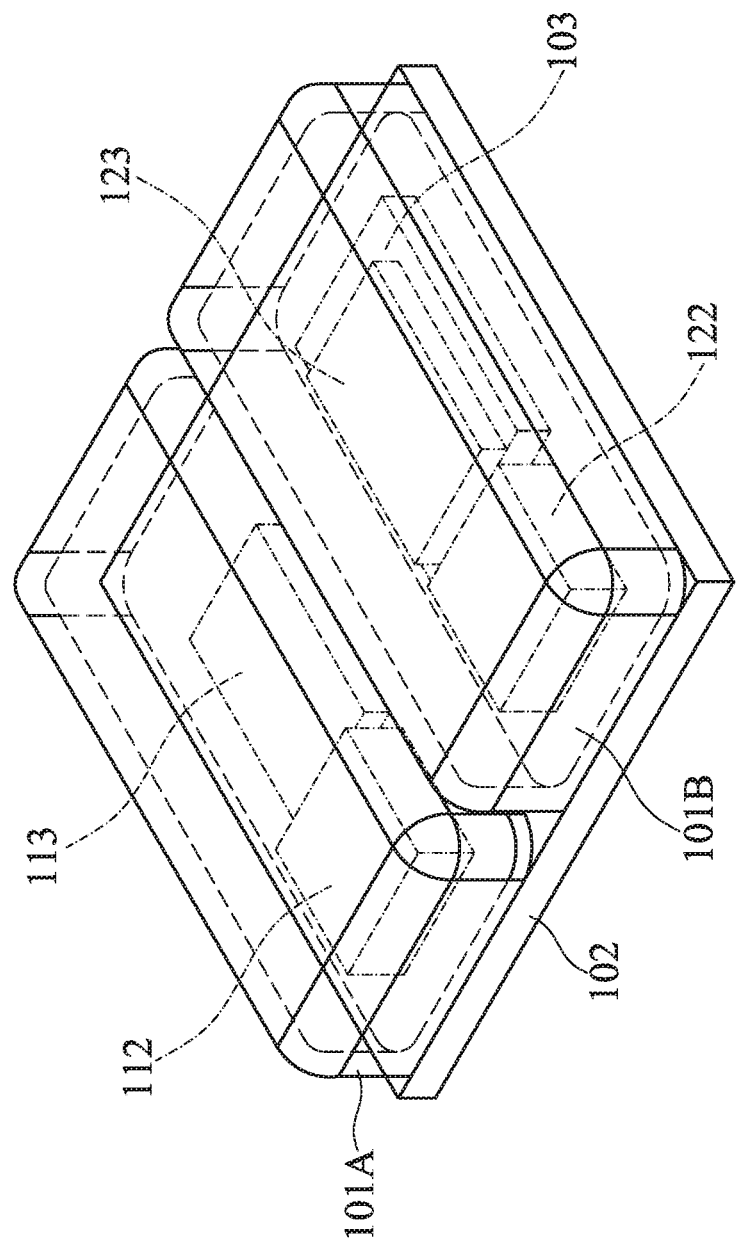
FIG. 1C is a perspective view of the small-array MEMS microphone apparatus in accordance with another embodiment of the invention.

FIG. 1C is a perspective view of the small-array MEMS microphone apparatus in accordance with another embodiment of the invention.

As depicted in FIG. 1C, in another embodiment, the microphone modules 110 and 120 are disposed on the circuit board 102, but have independent covers 101A and 101B, respectively. In addition, the processor is disposed in the microphone module 120, and overlaps with the integrated circuit 123.

Figure 1D:
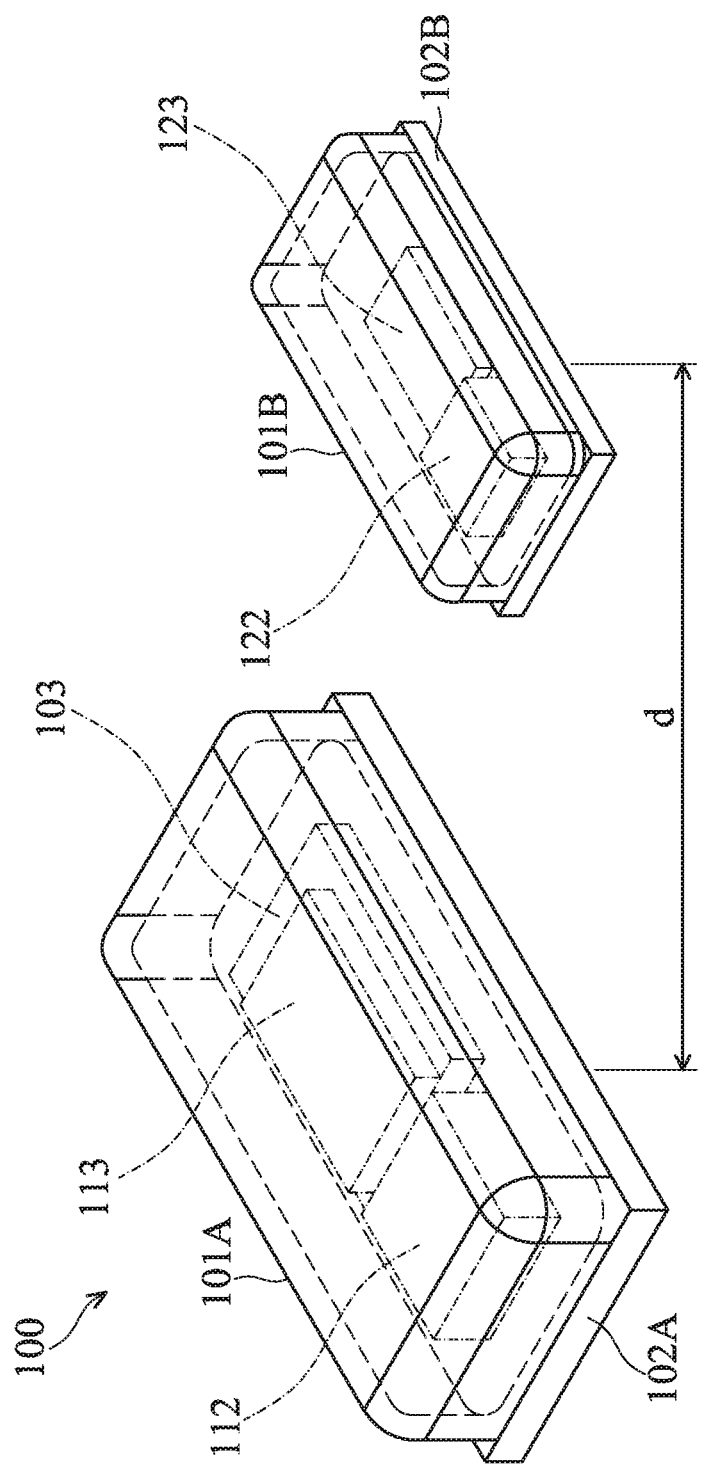
FIG. 1D is a perspective view of the small-array MEMS microphone apparatus in accordance with yet another embodiment of the invention.

FIG. 1D is a perspective view of the small-array MEMS microphone apparatus in accordance with yet another embodiment of the invention.

As depicted in FIG. 1D, in yet another embodiment, the microphone modules 110 and 120 are independent modules, and have independent circuit boards 102A and 102B, and independent covers 101A and 101B, respectively. In addition, the processor 103 is disposed in the microphone module 110, and overlaps with the integrated circuit 113. When a small microphone array is to be implemented, the distance d between the microphones 112 and 122 in the microphone modules 110 and 120 may be, for example, 5 mm. Because the microphone modules 110 and 120 can be installed separately, if a microphone array with a long microphone distance is required in the electronic device, the distance d between the microphones 112 and 122 can be, for example, 20 mm. In this embodiment, if the electronic device requires a microphone array formed by three or more microphone modules, one microphone module 110 (i.e., including the processor 103) and two or more microphone modules 120 can be disposed on the circuit board of the electronic device.

Figure 1E:
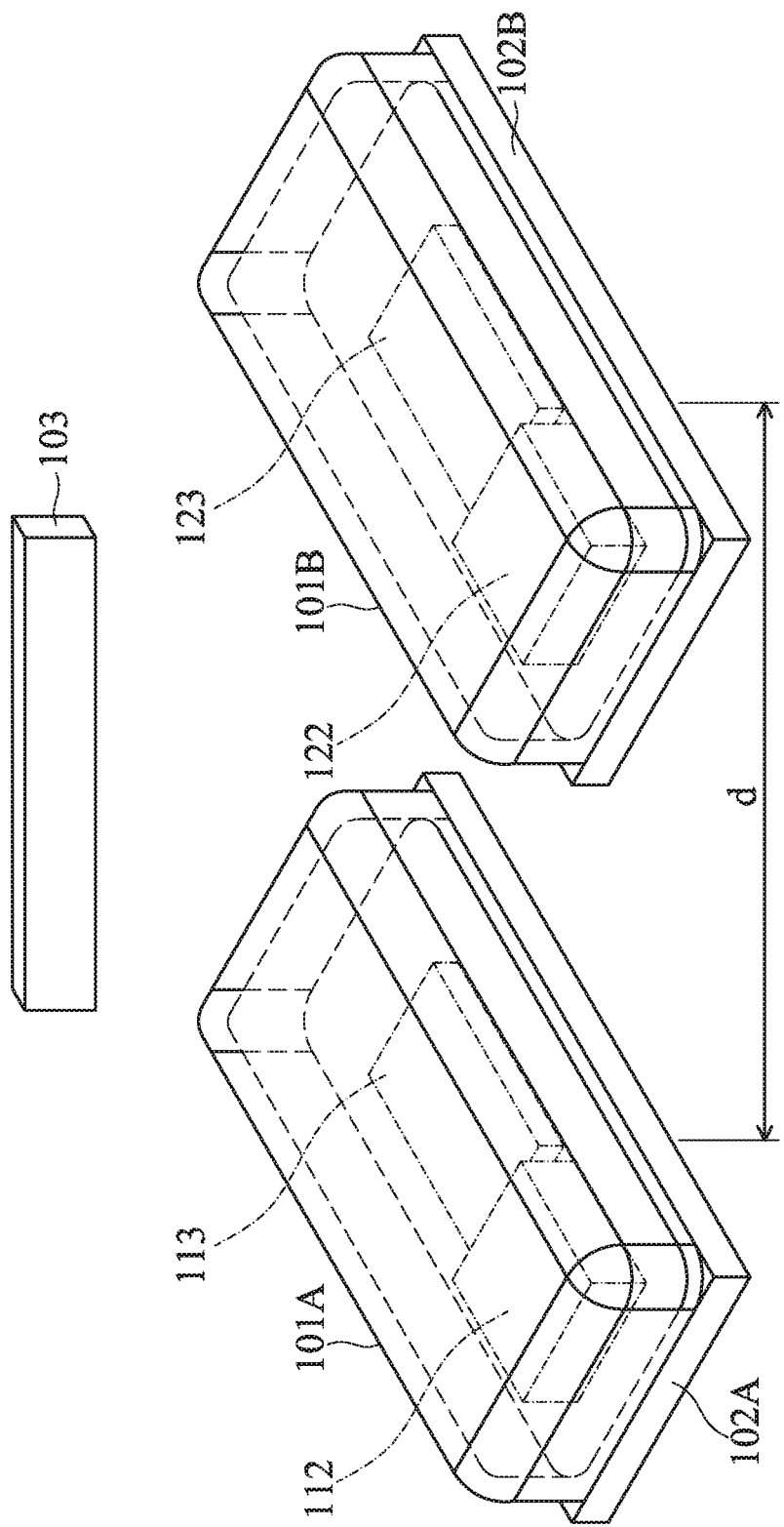
FIG. 1E is a perspective view of the small-array MEMS microphone apparatus in accordance with yet another embodiment of the invention.

FIG. 1E is a perspective view of the small-array MEMS microphone apparatus in accordance with yet another embodiment of the invention.

As depicted in FIG. 1E, in yet another embodiment, the microphone modules 110 and 120 are independent modules, and have independent circuit boards 102A and 102B, and independent covers 101A and 101B, respectively. The difference between FIG. 1D and FIG. 1E is that the processor 103 in FIG. 1E is separately disposed outside the microphone modules 110 and 120. Similarly, when a small microphone array is to be implemented, the distance d between the microphones 112 and 122 in the microphone modules 110 and 120 may be, for example, 5 mm. Because the microphone modules 110 and 120 can be installed separately, if a microphone array with a long microphone distance is required in the electronic device, the distance between the microphones 112 and 122 can be, for example, 20 mm. In this embodiment, the microphone modules 110 and 120 are substantially the same microphone module. If the electronic device requires a microphone array formed by three or more microphone modules, there microphone modules 110 can be used together with the processor 103 to be disposed on the circuit board of the electronic device, and the distance between any two microphone modules can be set according to actual needs.

Figure 2:
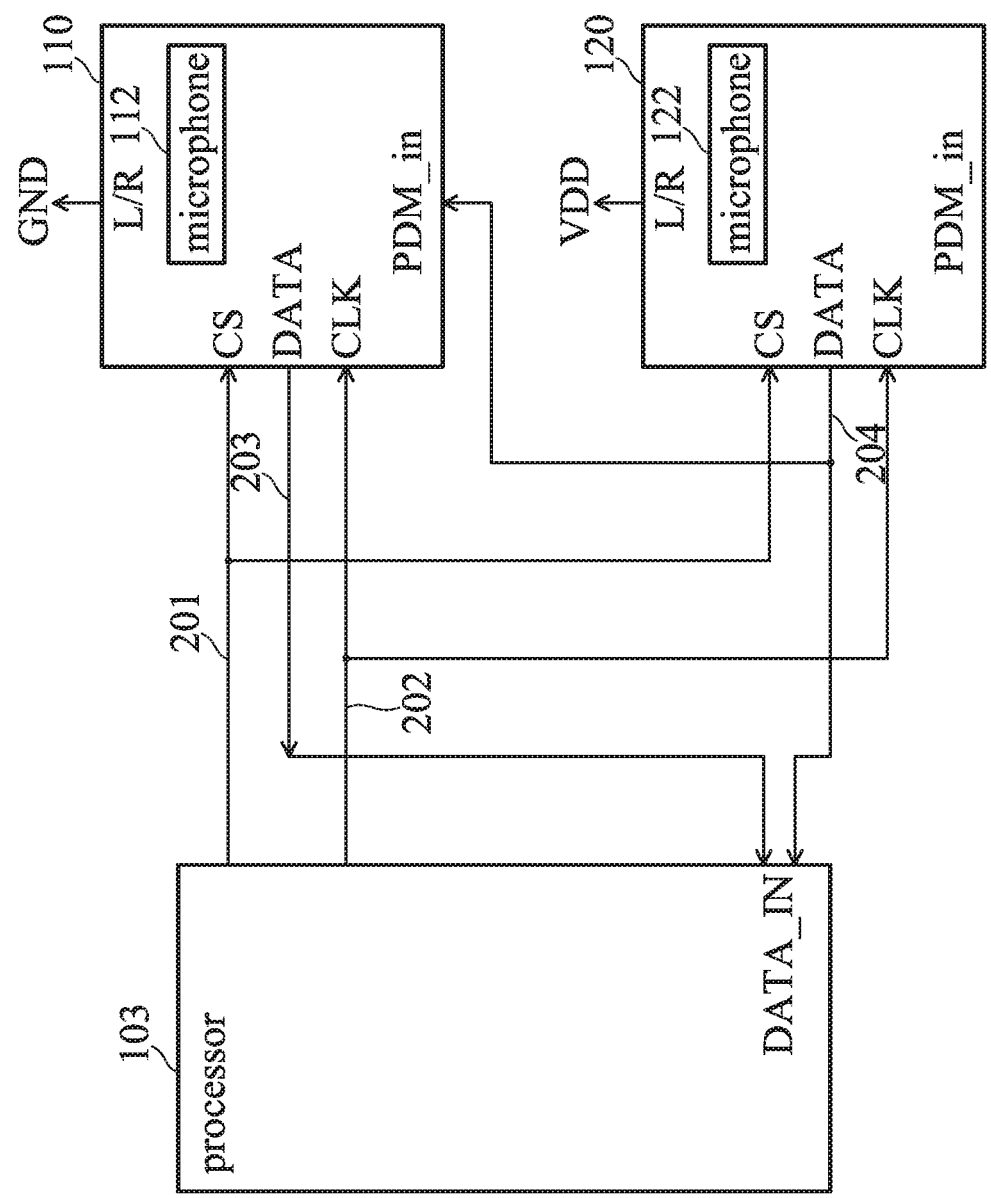
FIG. 2 is a block diagram of the small-array MEMS microphone apparatus in accordance with an embodiment of the invention.

FIG. 2 is a block diagram of the small-array MEMS microphone apparatus in accordance with an embodiment of the invention.

Referring to FIG. 1A and FIG. 2, the microphone modules 110 and 120 may include pins such as CS, DATA, CLK, PDM_in, and L/R. The processor 103 can send a control signal 201 to the CS pin (i.e., chip select) of the microphone modules 110 and 120 to control the microphone modules 110 and 120 to turn on or turn off. The processor 103 may also provide a clock signal 202 to the CLK pins (clock) or the microphone modules 110 and 120 to provide a clock signal required for the operation of the integrated circuits 113 and 123 in the microphone modules 110 and 120 (e.g., 2.048 MHz clock signal). The L/R pin of the microphone modules 110 and 120 is used to define whether the microphones 112 and 122 in the microphone modules 110 and 120 are used as a front microphone or a rear microphone. In this embodiment, the L/R pin of the microphone module 110 is grounded, which means that the microphone 112 is a front microphone. The L/R pin of the microphone module 120 is connected to the voltage VDD, so it means that the microphone 122 is a rear microphone.

The PDM_in pin of the microphone modules 110 and 120 is an input-signal pin, and the input signal can be logically calculated and time-delayed with the acoustic signals captured by the microphones 112 and 122. The output acoustic signals 203 and 204 of the microphone modules 110 and 120 are transmitted from the DATA pins of the microphone modules 110 and 120 to the DATA_IN pin of the processor 103. In the embodiment, due to design requirements, the PDM_in pin of the microphone module 120 does not input any acoustic signal, and the acoustic signal 204 output by the microphone module 120 may be, for example, the acoustic signal (i.e., MicB) captured by the microphone 122 that is bypassed to the DATA pin to output the acoustic signal 204. The acoustic signal 204 is input into the PDM_in pin of the microphone modules 110, and the acoustic signal 203 output by the microphone module 110 may include a sum signal SUM and a channel signal DMA, wherein the sum signal SUM may be obtained by adding the acoustic signal MicF captured by the microphone 112 to the acoustic signal 204 (i.e., MicB) input from the PDM_in pin. The channel signal DMA may be obtained by subtracting the product of a time delay $\tau$ and the acoustic signal MicB from the acoustic signal MicF, where DMA=MicF−MicB×$\tau$.

Figure 3A:
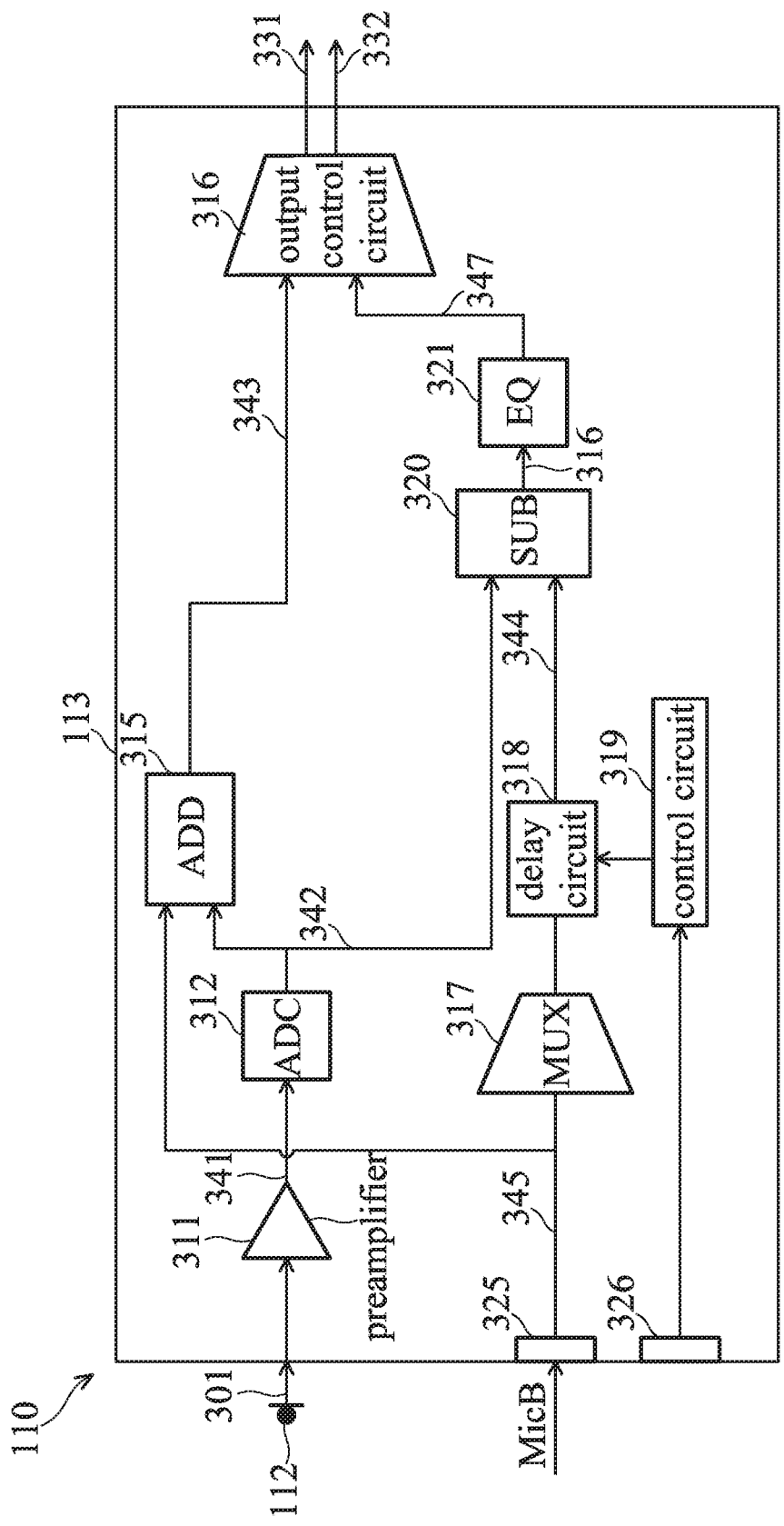
FIG. 3A is a block diagram of the microphone module in accordance with an embodiment of the invention.

FIG. 3A is a block diagram of the microphone module in accordance with an embodiment of the invention.

Referring to FIG. 2 and FIG. 3A, the microphone modules 110 and 120 are connected as shown in FIG. 2. For ease of description, the embodiment of FIG. 3 takes the microphone module 110 as an example, and the configuration of the microphone module 120 is similar to that of the microphone 110. The difference is that the PDM pin of the microphone module 120 has no input signal.

The integrated circuit 113 of the microphone module 110 includes a preamplifier 311, an analog-to-digital converter (ADC) 312, an adder 315, an output control circuit 316, a multiplexer 317, a delay circuit, a control circuit 319, a subtractor 320, and an equalizer 321.

For example, the acoustic signal 301 (e.g., an analog signal) captured by the microphone 112 needs to be amplified by the preamplifier to generate an acoustic signal 341 (e.g., an analog signal) for subsequent processing, where the acoustic signal 314 may be regarded as the MicF acoustic signal. The PDM_in pin 325 of the integrated circuit 113 may receive the MicB acoustic signal output by the integrated circuit 123, where the MicB acoustic signal by the acoustic signal 345 encoded by the PDM protocol.

The adder 315 may add the acoustic signal 342 (i.e., MicF acoustic signal) to the acoustic signal 345 (i.e., MicB acoustic signal) to obtain an acoustic signal 343 (i.e., the sum acoustic signal SUM). In addition, the MicB acoustic signal passes through the multiplexer 317 and delay circuit 318 to generate a delayed acoustic signal 344, and the subtractor 320 may subtract the acoustic signal 345 from the acoustic signal 342 to obtain a differential acoustic signal 346. The differential acoustic signal 346 may be processed by the equalizer 321 to obtain an acoustic signal 347, wherein the acoustic signal 347 can be regarded as the differential acoustic signal DMA. The output control circuit 316 may receive the acoustic signals 343 and 347, and select whether to output the acoustic signal 343 and/or acoustic signal 347 to generate an output acoustic signals 331 (i.e., the sum acoustic signal SUM) and 332 (i.e., the differential acoustic signal DMA). It should be noted that the PDM_in pin of the microphone module 120 has no input signal, and thus the microphone module 120 can output the MicB acoustic signal through an operation similar to that shown in FIG. 3A.

Figure 3B:
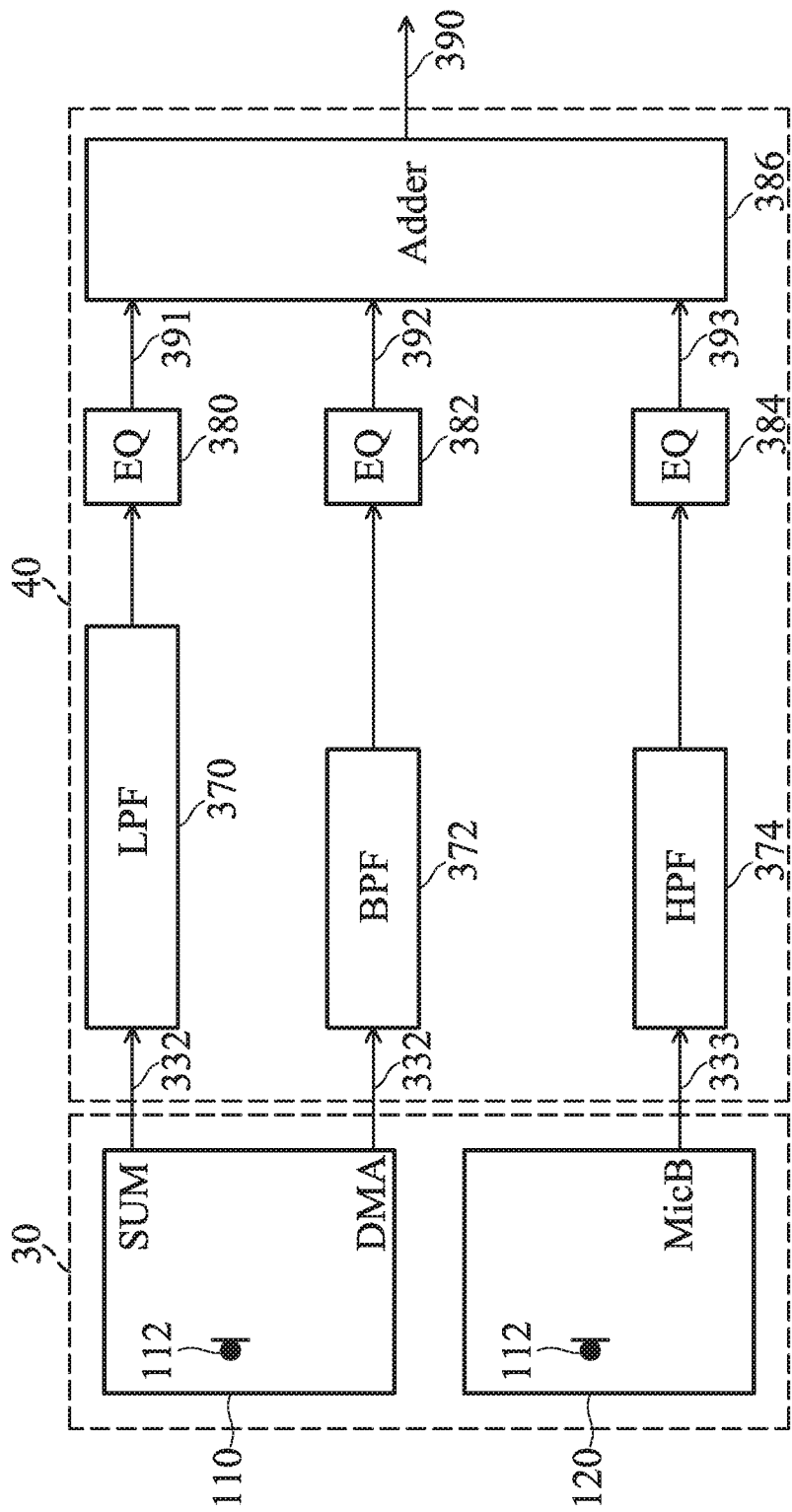
FIG. 3B is a diagram of acoustic response flattening performed by the microphone module and the processor in accordance with an embodiment of the invention.

FIG. 3B is a diagram of acoustic response flattening performed by the microphone module and the processor in accordance with an embodiment of the invention.

Referring to FIG. 2, FIG. 3A and FIG. 3B, the hardware portion 30 includes the microphone modules 110 and 120, and each component of the software portion 40 is performed by the processor 103. The microphone module 110 may output the acoustic signals 331 (i.e., the sum acoustic signal SUM) and 332 (i.e., the differential acoustic signal DMA) to the processor 103, and the microphone module 110 may output the MicB acoustic signal 333 to the processor 103. The processor 103 may apply different filters to different input acoustic signals SUM, DMA, and MicB.

For example, the processor 103 may apply a low-pass filter to the sum acoustic signal SUM, apply a band-pass filter to the differential acoustic signal DMA, and apply a high-pass filter 374 to the MicB acoustic signal. The pass band of the low-pass filter 370 is about 200 Hz or less (or 20 to 200 Hz), the pass band of the band-pass filter 372 is about 200 to 7400 Hz, and the pass band of the high-pass filter 374 is about 7400 Hz or above.

Figure 4A:
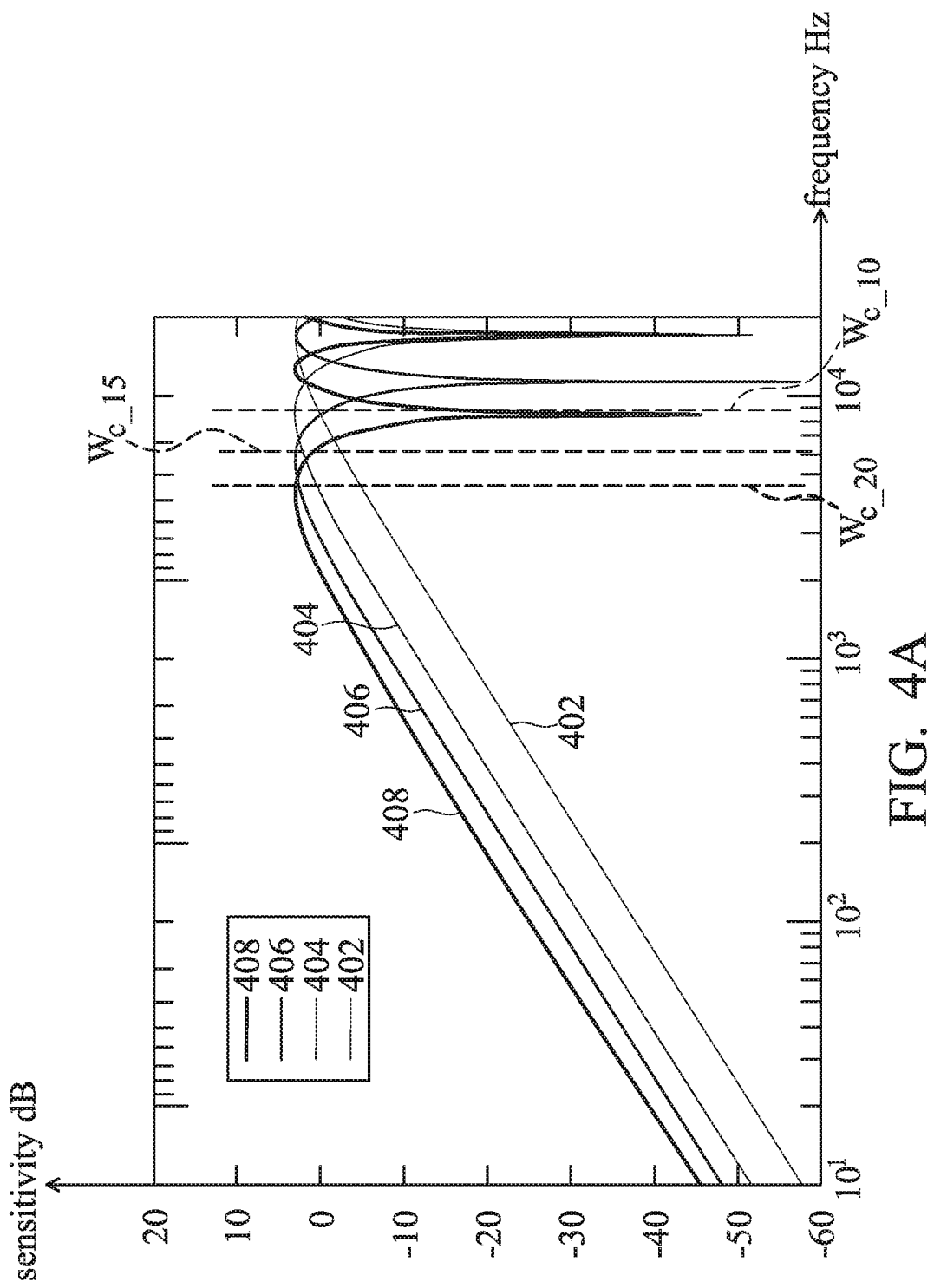
FIG. 4A is a diagram of the frequency-response curves of the differential acoustic signal in accordance with an embodiment of the invention.

As depicted in FIG. 4A, the curves 402, 404, 406, and 408 may represent the frequency response curve of the differential acoustic signal 332 (DMA) when the microphone distance d0 is 5 mm, 10 mm, 15 mm, and 20 mm, respectively. It can be seen that the frequency response curve of the differential acoustic signal 332 is not flat, and the lower the frequency of the differential acoustic signal 332, the lower the gain value (or sensitivity), as shown in FIG. 4A, wherein the cut-off frequency $w_c\_20$ is lower than the cut-off frequencies $w_c\_15$, $w_c\_10$, and $w_c\_5$ (not shown) of other curves 406, 404, and 402. The differential acoustic signal 332 is processed by the band-pass filter and then processed by the equalizer 382 to obtain the intermediate-frequency acoustic signal 392, and the frequency response curve of the intermediate-frequency acoustic signal 392 can be flatten (i.e., substantially balanced) at the intermediate frequency at about 200 to 7400 Hz. Similarly, the sum acoustic signal 331 (SUM) is processed by the low-pass filter 370 and then processed by the equalizer 380 to obtain the low-frequency acoustic signal 391. The MicB acoustic signal 333 is processed by the high-pass filter 374 and then processed by the equalizer 384 to obtain the high-frequency acoustic signal 393.

Figure 4B:
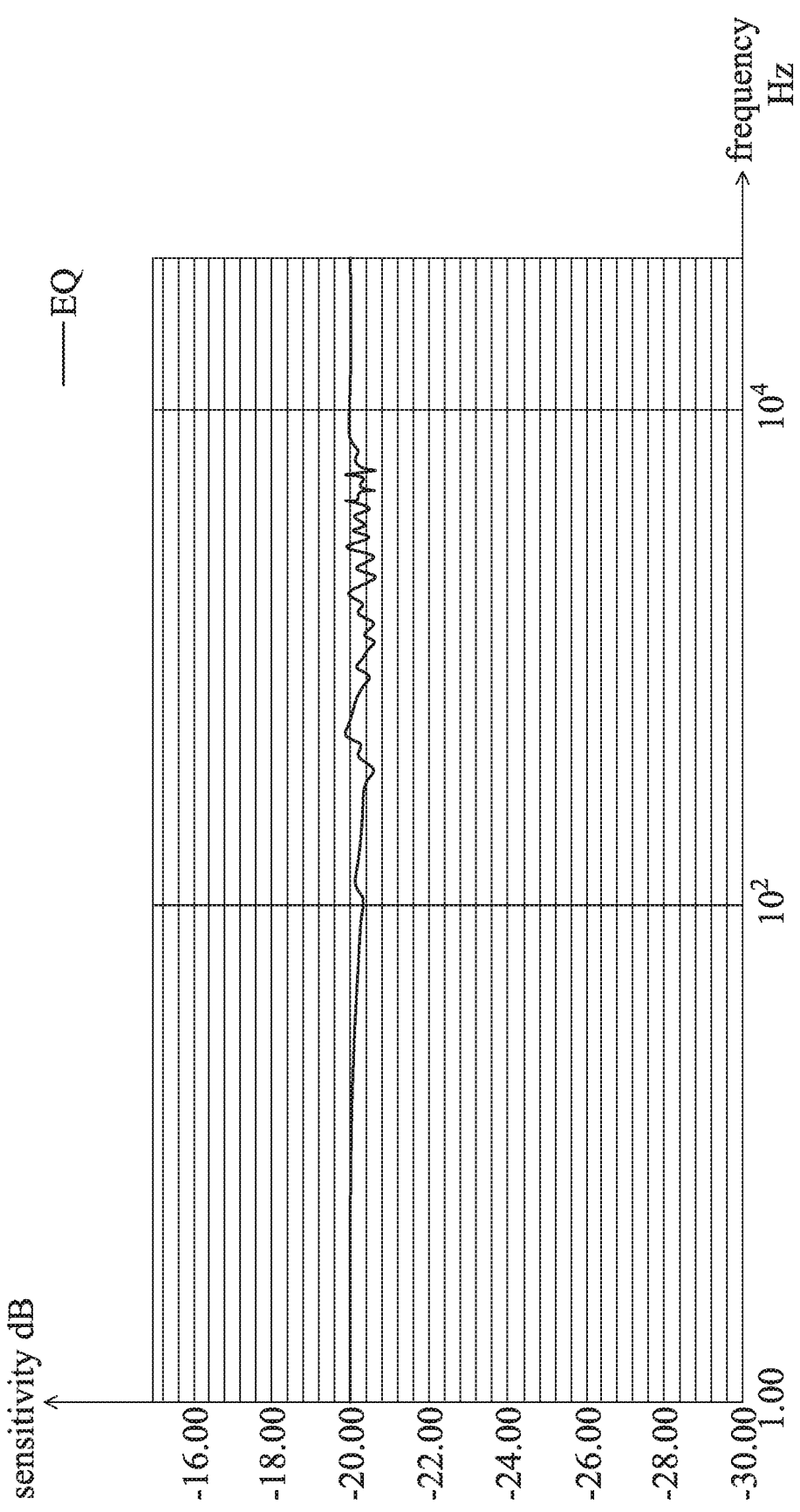
FIG. 4B is a diagram of the frequency-response curves of the output acoustic signal in accordance with an embodiment of the invention.

Finally, the adder 386 adds the low-frequency acoustic signal 391, the intermediate-frequency acoustic signal 392, and the high-frequency acoustic signal 393 to obtain the output acoustic signal 390. The frequency response curve of the acoustic signal 390 is shown in FIG. 4B, and the gain value can be flatten (i.e., substantially balanced) at low frequencies (200 Hz or less), intermediate frequencies (200 to 7400 Hz), and high frequencies (7400 Hz and above).

Figure 5A:
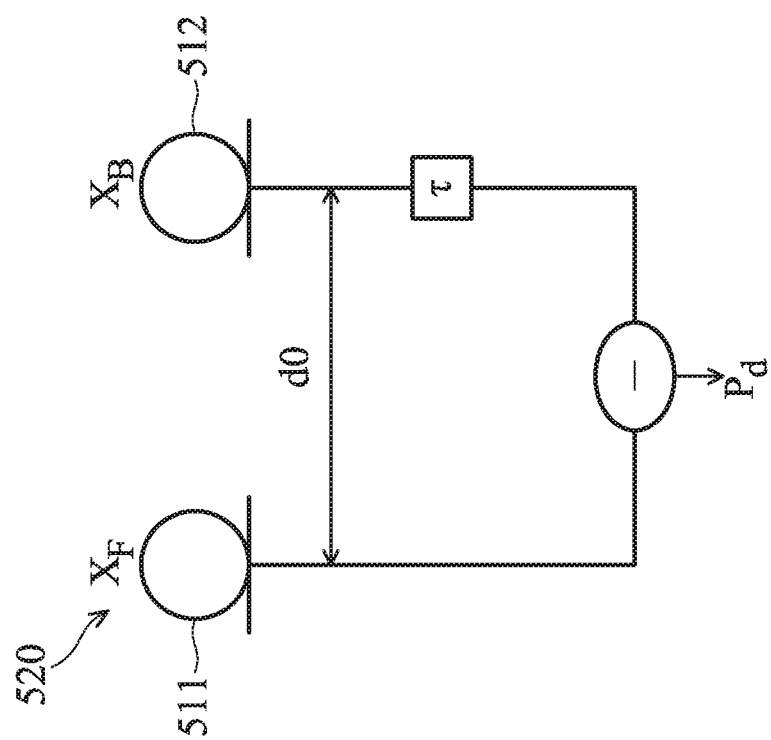
FIG. 5A is a diagram of a microphone array using two omnidirectional microphones.
Figure 5B:
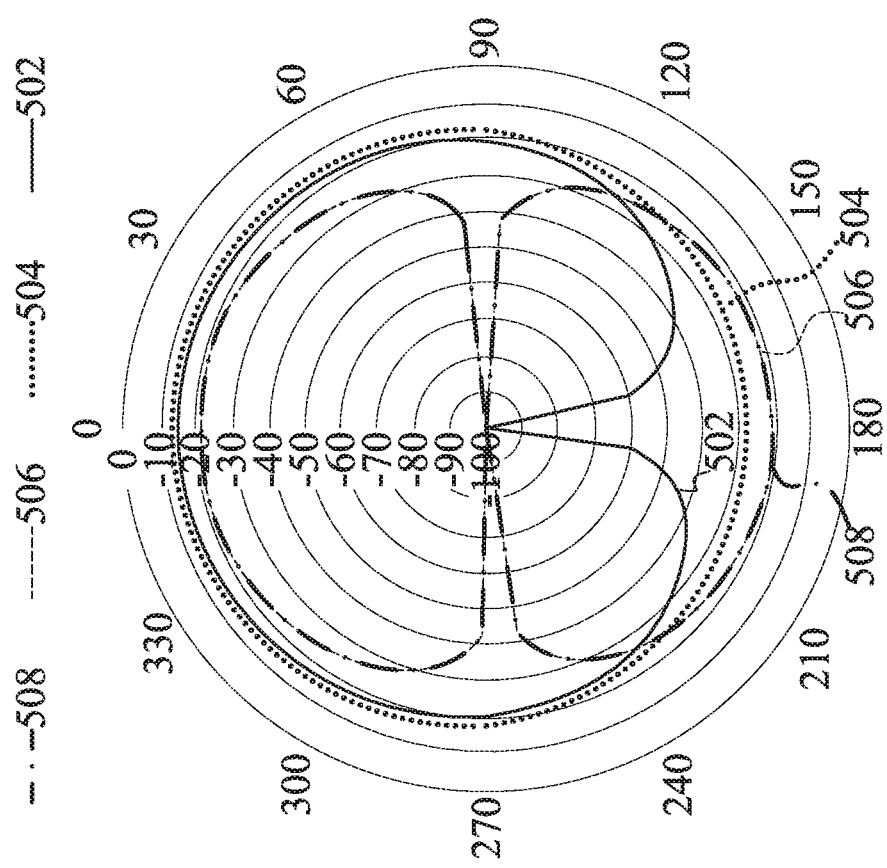
FIG. 5B is a polar patterns of a conventional microphone array.

FIG. 5A is a diagram of a microphone array using two omnidirectional microphones. FIG. 5B is a polar patterns of a conventional microphone array.

Conventional microphone arrays for noise suppression can be implemented by two preset microphones, such as a first combination of a unidirectional microphone (referred to as U-Mic) plus an omnidirectional microphone (referred to as O-Mic), or a second combination of two omnidirectional microphones.

Taking the first combination as an example, the conventional directional electret microphone mainly uses sound to generate the different in sound pressure caused by the path difference between the sound path of the front acoustic hole and another sound path of the rear acoustic hole. The difference in sound pressure can be used to generate the displacement of the diaphragm to generate the difference in the capacitance of the microphones, so a signal output can be formed to achieve the fixed directivity of the microphone array. If a microphone array comprising a directional microphone and an omnidirectional microphone is used in the electronic device, a directional microphone with a front acoustic hole and a rear acoustic hole needs to be installed. Accordingly, the front/rear sound guides needs to be designed in the mechanism of the electronic device, and it will increase the difficulty of designing the electronic device. If the electronic device does not allow a hole design on the rear appearance, the directivity of the microphone array will be lost. If it is desired to maintain the directivity of the microphone array, the design of the sound guide leading into the rear acoustic hole of the microphone must be introduced from the front of the electronic device. However, the different lengths of the front and rear sound guides will cause the original directivity of the simple microphone array to be different from that of the microphone array after it is placed in the mechanism of the electronic device, resulting in inconvenience in use and reduced noise suppression performance.

Taking the second combination as an example, referring to FIG. 5A, in the microphone array of the second combination, the acoustic signals detected by the two microphones are generated by the vibration of the two microphone diaphragms, and the consistency of the characteristics of these two microphone diaphragms will affect the consistency of the acoustic signals generated by the two microphones. However, it is difficult to achieve consistency in the stretching process and electrical manufacturing process of the microphone diaphragms. If the two microphones 511 and 512 of the microphones array 500 both use MEMS microphones, the consistency of the microphone diaphragms can be improved.

If the microphone array 500 is implemented by two MEMS omnidirectional microphones 511 and 512, when the sound source 520 emits sound, the differential signal Pd, that is obtained by performing summation and delay calculations of the acoustic signals XF and XB respectively detected by the microphones 511 (i.e., front microphone) and 512 (i.e., rear microphone), can have directivity and achieve the function of noise suppression, wherein the differential signal $P_d = X_F - X_B \times \tau$, where delay $\tau = d0/c$; d0 denotes the distance between the microphones 511 and 512; c denotes the sound speed. In addition, it should be noted that if a small microphone array formed by two omnidirectional microphones is to generate beams, the accuracy of the sample delay $\tau$ is also required.

The curves 508, 506, 504, and 502 shown in FIG. 5B are polar patterns obtained when the distance between the microphones 511 and 512 is 5 mm, and the software sampling rate is 16 KHz, 32 KHz, 48 KHz, and 2.048 MHz, respectively. If the sampling delay is generated by software (i.e., the processor), the accuracy of the sampling delay is determined by the software sample rate. However, if the sampling rate of the software is low, the originally required beam direction will change from unidirectional characteristics (e.g., a cardioid polar pattern, as shown by curve 502 in FIG. 5B) to bidirectional characteristics (e.g., a dipole polar pattern, as shown by curves 506 and 508 in FIG. 5B). Although increasing the sampling rate of the software can improve the accuracy of the sampling delay, the calculation time of the software will be longer and the power consumption of the processor will also increase.

If the distance d0 between the microphones 511 and 512 is increased, the value of the sampling delay can be increased, and a lower software sampling rate can be used to achieve the required sampling delay accuracy. The increased microphone distance d0 cannot meet the requirement of a small microphone array. The cut-off frequency $w_c$ of the frequency response of the formed beam will also be reduced, and the effective bandwidth of the microphone array is narrowed. As a result, the noise cancellation/suppression capability of the small-array MEMS microphone apparatus will be affected, and the output acoustic signal will greatly reduce the speech-recognition rate of the backend speech-recognition apparatus.

Figure 6:
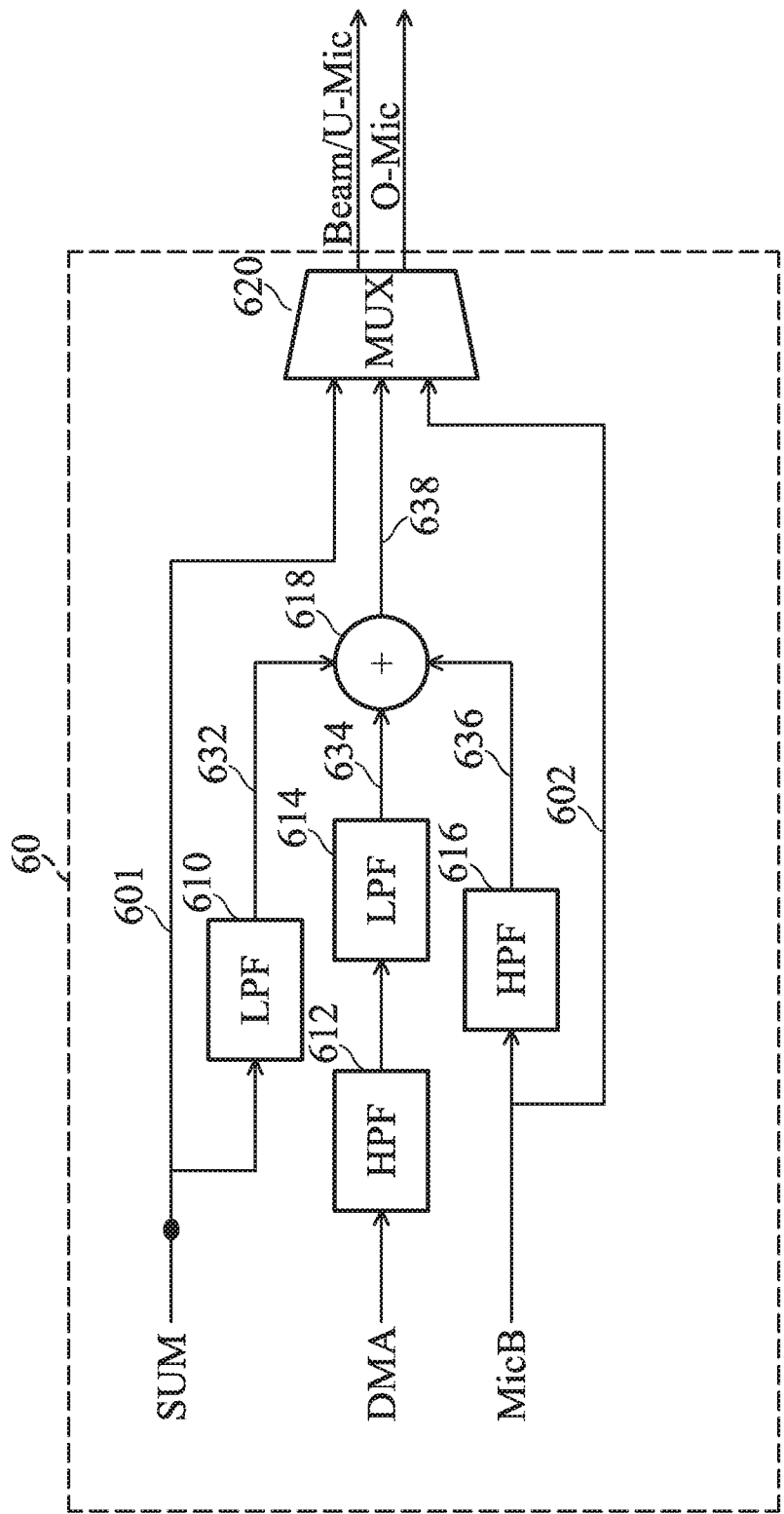
FIG. 6 is a block diagram of the microphone module in accordance with another embodiment of the invention.

FIG. 6 is a block diagram of the microphone module in accordance with another embodiment of the invention.

Referring to FIGS. 3A-3B and FIG. 6, the difference between the microphone modules in FIG. 3B and FIG. 6 is that the software portion 40 in FIG. 3B is implemented by hardware circuits in FIG. 6, such as the hardware portion 60. The hardware portion 60 may be included within the integrated circuits 113 and 123, or implemented by other digital circuits in the small-array MEMS microphone apparatus 100. The hardware circuits of the microphone modules 110 and 120 for generating the sum acoustic signal SUM, differential acoustic signal DMA, and MicB acoustic signal can be referred to FIG. 3A, and the details will be omitted here. For example, when the bypass mode is not activated, the switches 601 and 602 are in an open state, and the sum acoustic signal generated by the microphone module 110 can be input into the low-pass filter 610 to generate an acoustic signal 632. The differential acoustic signal DMA may pass through the high-pass filter 612 and low-pass filter 612 (e.g., both can be regarded as a band-pass filter, and the order can be exchanged) to generate an acoustic signal 634. The MicB acoustic signal may pass through the high-pass filter 616 to generate an acoustic signal 636. The acoustic signals 632, 634, and 636 are then added by the adder circuit 618 to generate an acoustic signal 638. The acoustic signal 618 is similar to the acoustic signal 390 in FIG. 3B. The frequency-response curve of the acoustic signal 638 is shown in FIG. 4B, where the gain value can be flatten (i.e., substantially balanced) at low frequencies (200 Hz or less), intermediate frequencies (200 to 7400 Hz), and high frequencies (7400 Hz or above). In some embodiments, the acoustic signals 632, 634, and 636 can be processed similarly to the equalizers 380-384 in FIG. 3B before being input into the adder circuit 618.

In addition, when the bypass mode is activated, the switches 601 and 602 are in a close state, and the sum acoustic signal SUM and the MicB acoustic signal are transmitted to the multiplexer 620, and the multiplexer 620 may select whether to output the acoustic signal 641 and/or acoustic signal 642. The acoustic signal 641 may represent a directional beam, or can be regarded as a U-Mic acoustic signal. The acoustic signal 642 may represent an omnidirectional acoustic signal, or can be regarded as a O-Mic acoustic signal.

Figure 7:
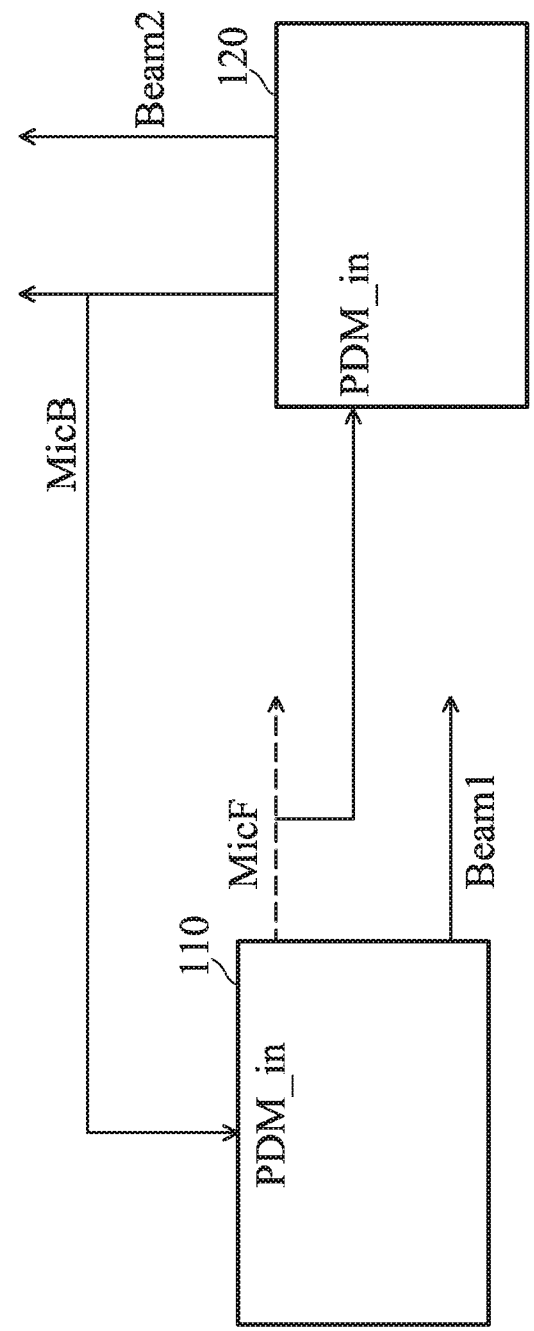
FIG. 7 is a block diagram of the microphone module in accordance with an embodiment of FIG. 6.

FIG. 7 is a block diagram of the microphone module in accordance with an embodiment of FIG. 6.

In the embodiment of FIG. 6, each microphone module may output the sum acoustic signal SUM or the bypass acoustic signal BYPASS, and the differential acoustic signal DMA. The integrated circuit in each microphone module may include functions such as an adder, a subtractor, DMA (differentiation and delay), equalizer (EQ). Thus, using the connection of the microphone modules 110 and 120 shown in FIG. 7, the MicF acoustic signal output by the microphone module 110 can be used as the input signal at the PDM_in pin of the microphone module 120, and the MicB acoustic signal output by the microphone module 120 is used as the input signal of the PDM_in pin of the microphone module 110. Thus, the microphone modules 110 and 120 can provide two directional acoustic signals (e.g., Beam1 and Beam2) having different polar patterns and directivities, and two omnidirectional acoustic signals (e.g., MicF and MicB acoustic signals), that are for use by the subsequent platform of the microphone modules 110 and 120. That is, the microphone modules 110 and 120 can provide the acoustic signals similar to those generated by the first combination of small microphone array (i.e., U-Mic plus 0-Mic) to subsequent platform to achieve better noise suppression.

Figure 8:
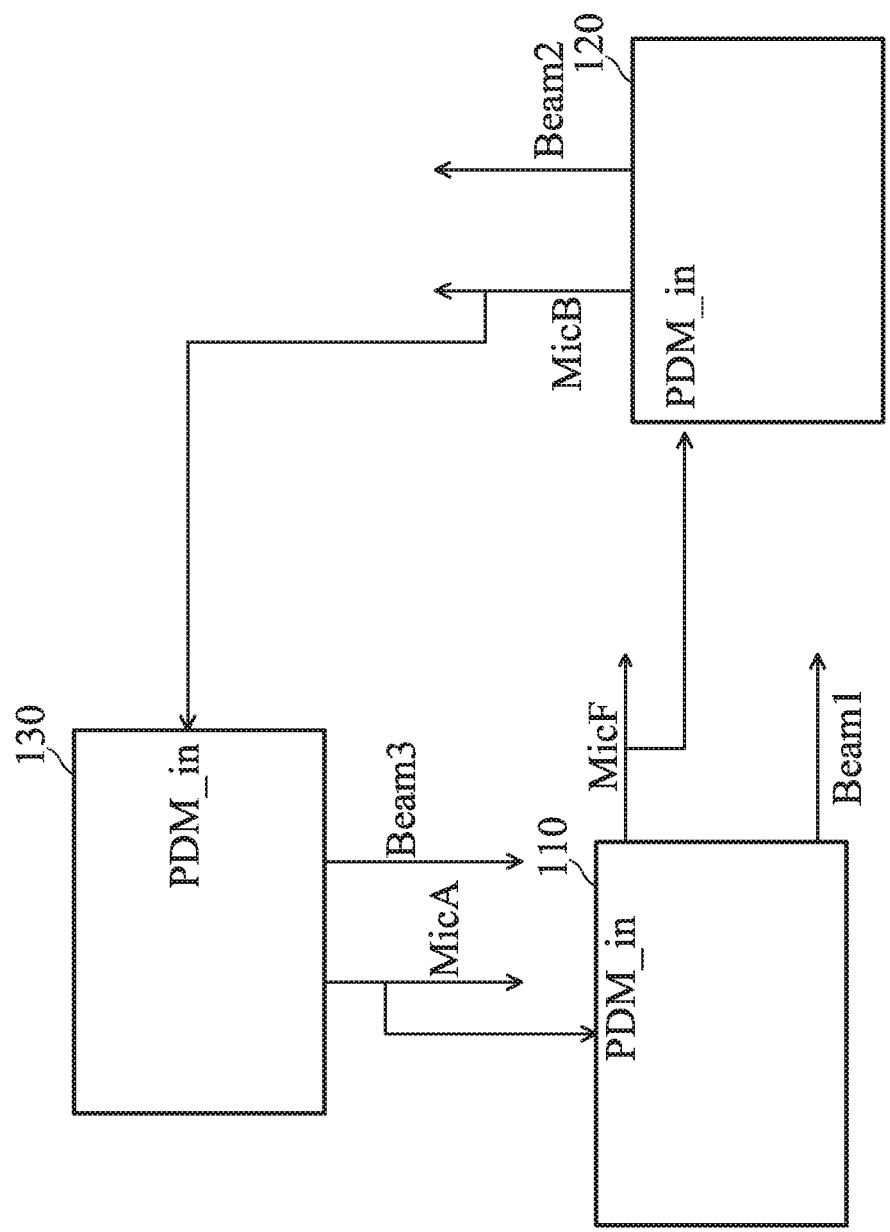
FIG. 8 is a diagram of the connection of the microphone modules in accordance with the embodiment of FIG. 6.

FIG. 8 is a diagram of the connection of the microphone modules in accordance with the embodiment of FIG. 6.

In FIG. 8, the microphone module 130 is identical to the microphone module 110. In the embodiment of FIG. 7, it can be understood that through appropriate connections, the microphone modules 110 and 120 can output directional acoustic signals (e.g., Beam1 and Beam2) having different polarity patterns and directivities, and omnidirectional acoustic signals (e.g., MicF, MicB, and MicA acoustic signals).

For example, the MicF acoustic signal output by the microphone module 110 may be input into the PDM_in pin of the microphone module 120. The MicB acoustic signal output by the microphone module 120 may be input into the PDM_in pin of the microphone module 130, and the MicA acoustic signal output by the microphone module 130 may be input into the PDM_in pin of the microphone module 110. That is, the integrated circuit 113 of the microphone module 110 may process the MicF and MicA acoustic signals, and the integrated circuit 123 of the microphone module 120 may process the MicB and MicF acoustic signals, and the integrated circuit of the microphone module 130 may process the MicA and MicB acoustic signals. Accordingly, the integrated circuit in each microphone module will perform calculations on two input acoustic signals to obtain a directional differential acoustic signal (beam) and an omnidirectional acoustic signal.

Figure 9:
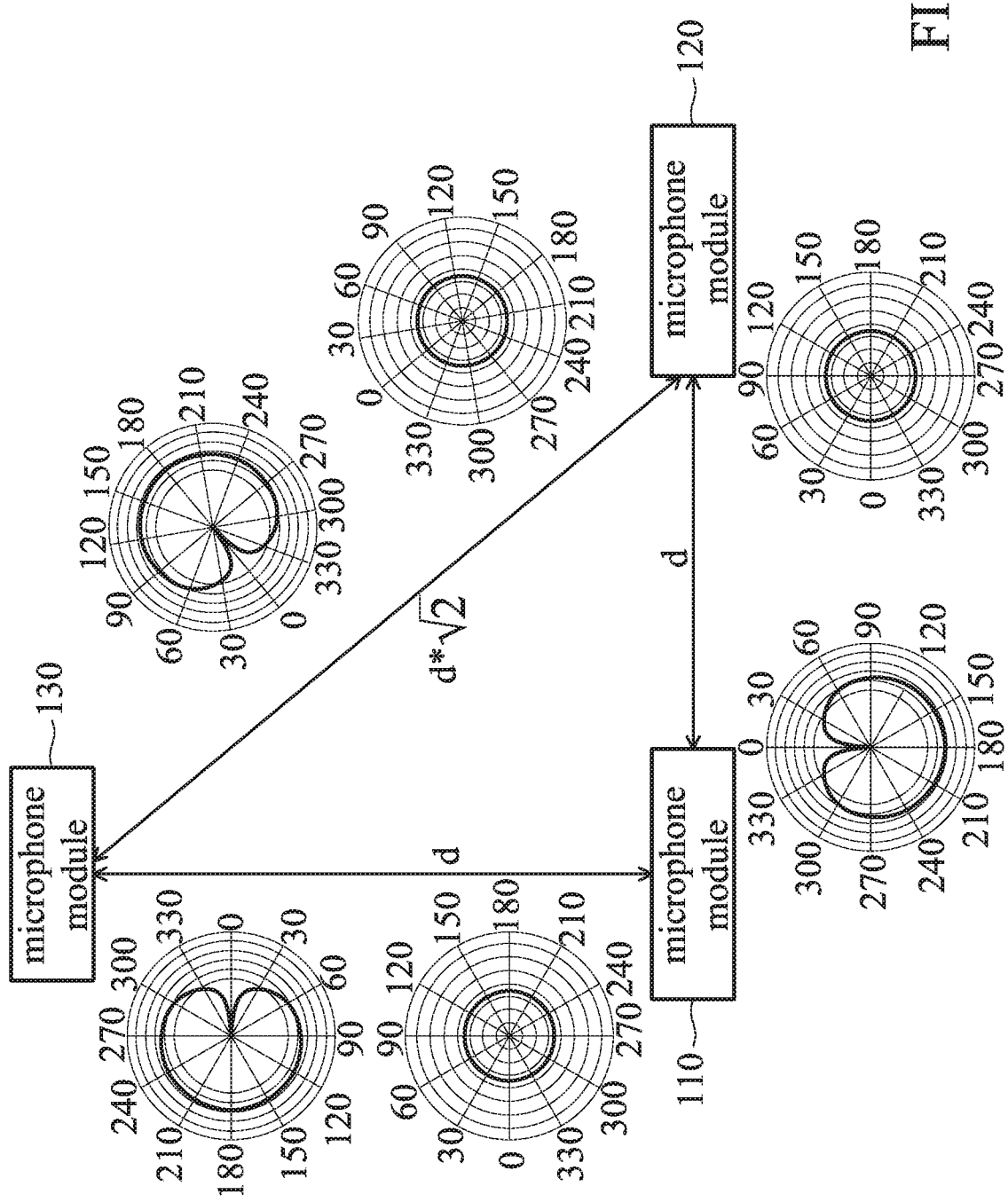
FIG. 9 is a diagram of the connection of microphone modules in accordance with an embodiment of FIG. 8.

FIG. 9 is a diagram of the connection of microphone modules in accordance with an embodiment of FIG. 8.

The microphone modules 110, 120, and 130 in FIG. 9 are arranged in an isosceles right triangle. For example, the distance between the microphone 112 of the microphone module 110 and the microphone 122 of the microphone module 120 is d (e.g., 5 mm), and the distance between the microphone 112 of the microphone module 110 and the microphone of the microphone module 130 is also d. The distance between the microphone 122 of the microphone module 120 and the microphone of the microphone module 130 is $d*\sqrt{2}$. In the embodiment, each of the cardioid polar patterns may indicate the polar patterns of the differential acoustic signal generated by each microphone, and the units of the sensitivity (or gain) is similar to those of the polar patterns in FIG. 5B. In addition, the circular-like polar pattern (i.e., with omni-directivity) may indicate the polar pattern of the bypass acoustic signal generated by each microphone module.

For example, the directivity of the differential acoustic signal generated by the microphone module 110 is toward the left, and the directivity of the differential acoustic signal generated by the microphone module 120 is downward, and the directivity of the differential acoustic signal generated by the microphone module 130 is toward the upper right, which means that the directivity of each differential acoustic signal is perpendicular to the connection between two adjacent microphone modules and faces away from the small-array MEMS microphone apparatus 100.

Figure 10:
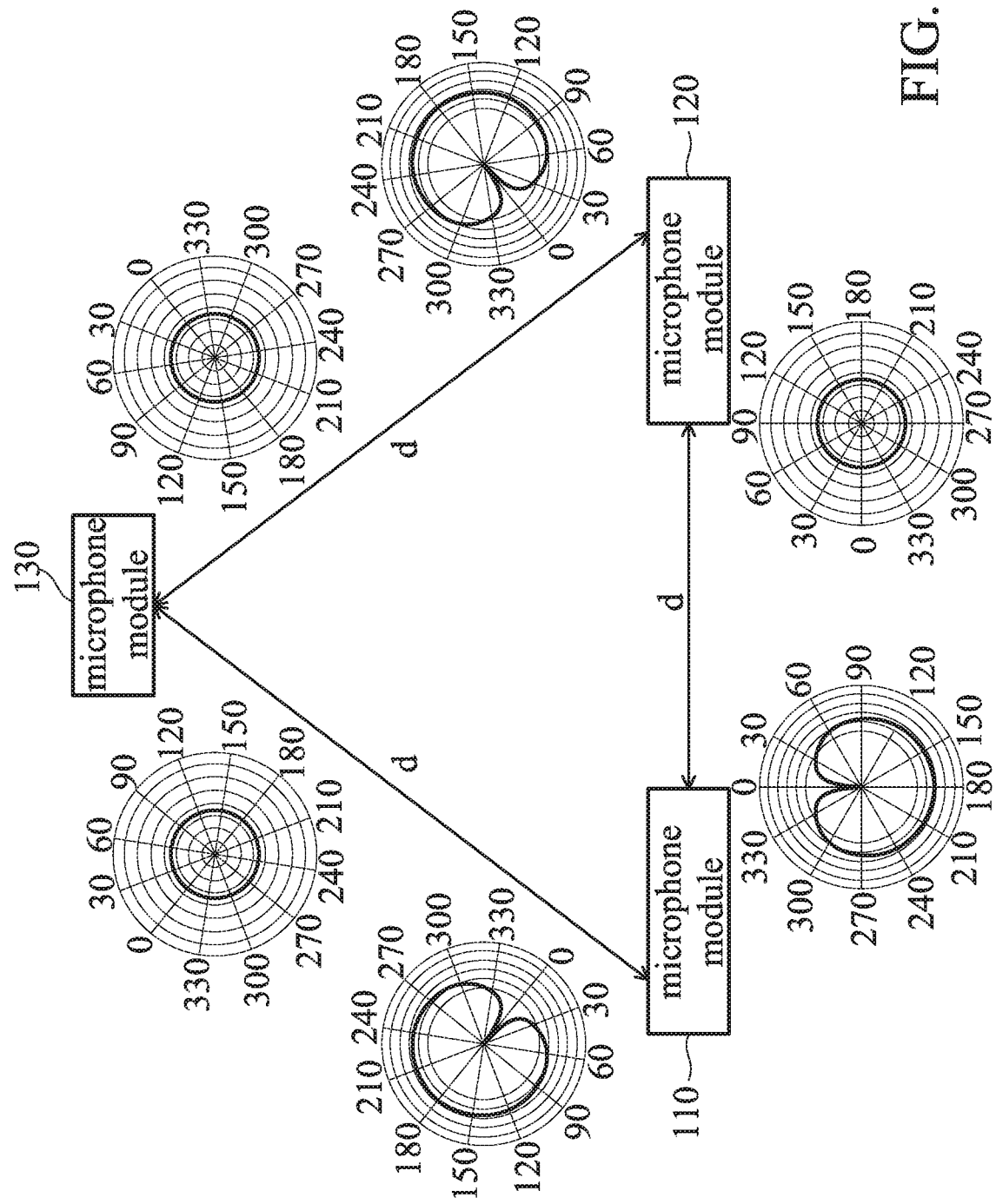
FIG. 10 is a diagram of the connection of microphone modules in accordance with the embodiment of FIG. 8.

FIG. 10 is a diagram of the connection of microphone modules in accordance with the embodiment of FIG. 8.

The microphone modules 110, 120, and 130 in FIG. 10 are arranged in an equilateral triangle. For example, the distance between two adjacent microphone modules is d. In the embodiment, each of the cardioid polar patterns may indicate the polar patterns of the differential acoustic signal generated by each microphone, and the units of the sensitivity (or gain) is similar to those of the polar patterns in FIG. 5B. In addition, the circular-like polar pattern (i.e., with omni-directivity) may indicate the polar pattern of the bypass acoustic signal generated by each microphone module. For example, the directivity of the differential acoustic signal generated by the microphone module 110 is toward the upper left, and the directivity of the differential acoustic signal generated by the microphone module 120 is downward, and the directivity of the differential acoustic signal generated by the microphone module 130 is toward the upper right, which means that the directivity of each differential acoustic signal is perpendicular to the connection between two adjacent microphone modules and faces away from the small-array MEMS microphone apparatus 100.

Figure 11:
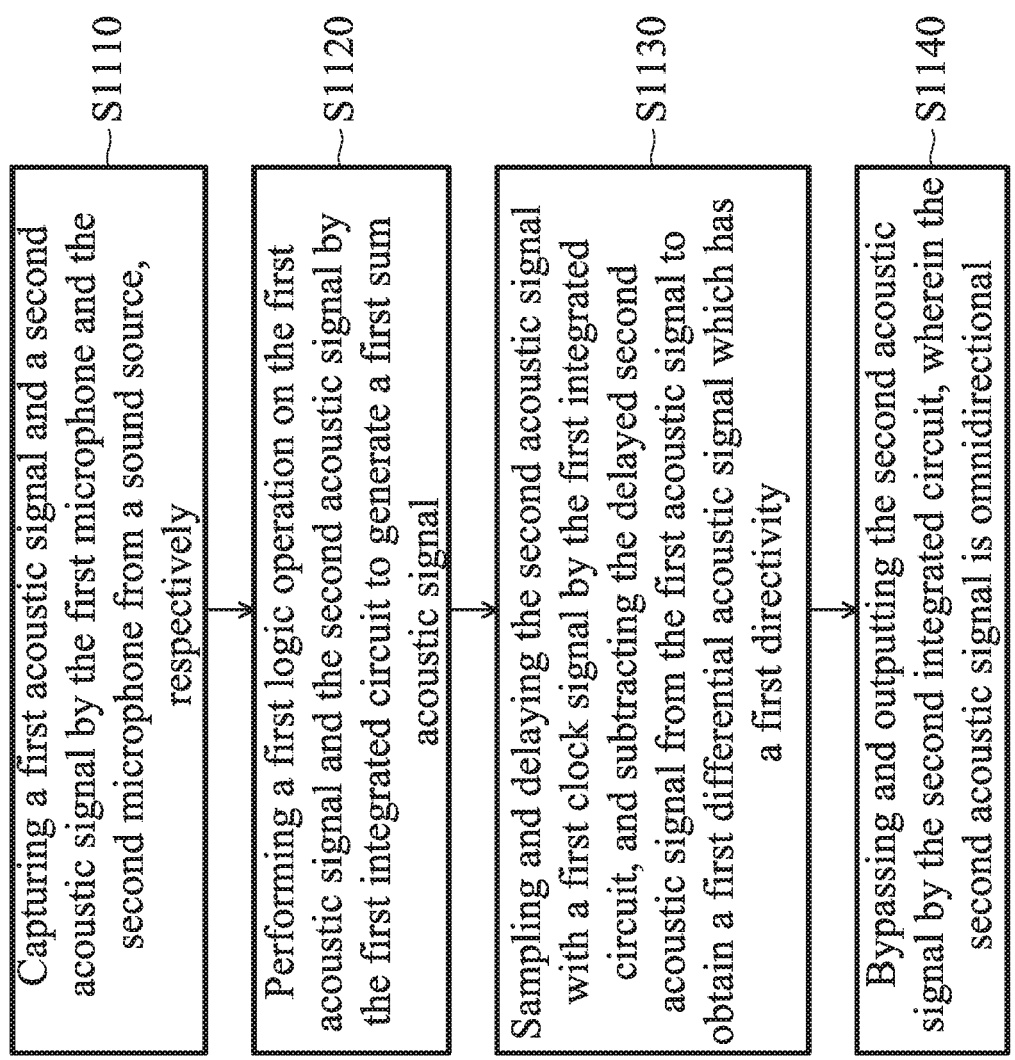
FIG. 11 is a flow chart of a noise-suppression method in accordance with an embodiment of the invention.

FIG. 11 is a flow chart of a noise-suppression method in accordance with an embodiment of the invention.

In step S1110, a first acoustic signal and a second acoustic signal are captured by a first microphone and a second microphone from a sound source, respectively.

In step S1120, a first integrated circuit performs a first logic operation on the first acoustic signal and the second acoustic signal to generate a first sum acoustic signal. For example, the first sum acoustic signal SUM can be regarded as an omnidirectional acoustic signal that has a better sensitivity, noise floor, and signal-to-noise ratio (SNR).

In step S1130, the second acoustic signal is sampled and delayed with a first clock signal by the first integrated circuit, and the delayed second acoustic signal is subtracted from the first acoustic signal to obtain a first differential acoustic signal which has a first directivity. The differential acoustic signal DMA may be capable of providing a beam, such as the acoustic signal provided by the directional microphone in the microphone array of the first combination. In addition, the sampling delay of the differential acoustic signal DMA can be obtained by the hardware circuits sampling at a clock of 2.048 MHz (not limited). In this configuration, the microphone distance (e.g., 5 mm) can meet the requirement of a small microphone array, and the effect of sufficient accuracy of sampling delay, fast calculations, and power saving can also be achieved.

In step S1140, the second integrated circuit bypasses and outputs the second acoustic signal, wherein the second acoustic signal is omnidirectional.

In view of the above, a small-array MEMS microphone apparatus and a noise-suppression method thereof are provided. The small-array MEMS microphone apparatus is capable of providing a sum acoustic signal SUM, a differential acoustic signal DMA, and a bypass acoustic signal BYPASS (e.g., MicB acoustic signal) to the backend speech-recognition apparatus. The sum acoustic signal SUM can be regarded as the acoustic signal provided by the omnidirectional microphone in the microphone array of the first combination. Compared with the acoustic signals XF and XB, the sensitivity of the sum acoustic signal SUM is increased by about 6 dB (e.g., signal correlation is 1), the noise floor is increased by about 3 dB (e.g., signal correlation is 0), and the SNR is increased by about 3 dB. The differential acoustic signal can provide a beam, such as the acoustic signal provided by the directional microphone in the microphone array of the first combination. In addition, the sampling delay of the differential acoustic signal DMA is obtained by hardware circuits sampling at a clock rate of 2.048 MHz. In this configuration, the microphone distance (e.g., 5 mm) can meet the requirement of a small microphone array, and the effect of sufficient accuracy of sampling delay, fast calculations, and power saving can also be achieved. The bypass acoustic signal BYPASS can be regarded as the acoustic signal provided by the omnidirectional microphone in the microphone array of the first combination.

Words such as "first", "second", and "third" used in the claims are used to modify the elements in the claims, and are not used to indicate that there is an order of priority, antecedent relationship, or It is an element that precedes another element, or the chronological order of execution of method steps, which is only used to distinguish elements with the same name.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A small-array MEMS (micro-electro mechanical system) microphone apparatus, comprising:
    a microphone cover;
    a circuit board coupled to the microphone cover, comprising a first acoustic hole and a second acoustic hole;
    a first microphone module, comprising: a first microphone and a first integrated circuit, wherein the first microphone captures a first acoustic signal from a sound source through the first acoustic hole;
    a second microphone module, comprising: a second microphone and a second integrated circuit, wherein the second microphone captures a second acoustic signal from the sound source through the second acoustic hole, wherein the first microphone and the second microphone have the same sensitivity, phase, and omnidirectivity;
    wherein the first integrated circuit performs a first logic operation on the first acoustic signal and the second acoustic signal to generate a first sum acoustic signal;
    wherein the first integrated circuit performs a sampling delay on the second acoustic signal with a first clock signal, and subtracts the delayed second acoustic signal from the first acoustic signal to obtain a first differential acoustic signal, and the first differential acoustic signal has a first directivity,
    wherein the second integrated circuit bypasses and outputs the second acoustic signal, and the second acoustic signal is omnidirectional.

2. The small-array MEMS microphone apparatus as claimed in claim 1, wherein the first integrated circuit and the second integrated circuits are application-specific integrated circuits, and the first clock signal has a frequency of 2.048 MHz.

3. The small-array MEMS microphone apparatus as claimed in claim 2, wherein there is a first distance of 5 mm between the first microphone and the second microphone.

4. The small-array MEMS microphone apparatus as claimed in claim 3, wherein the first integrated circuit applies a low-pass filter and a first equalizer, a band-pass filter and a second equalizer, and a high-pass filter and a third equalizer, respectively, on the first sum acoustic signal, the first differential acoustic signal, and the second acoustic signal to obtain a first low-frequency acoustic signal, a first intermediate-frequency acoustic signal, and a first high-frequency acoustic signal, and the sensitivities of the first low-frequency acoustic signal, the first intermediate-frequency acoustic signal, and the first high-frequency acoustic signal are substantially the same.

5. The small-array MEMS microphone apparatus as claimed in claim 4, wherein a first pass band of the low-pass filter is 200 Hz or less, a second pass band of the band-pass filter is from 200 Hz to 7400 Hz, and a third pass band of the high-pass filter is 7400 Hz or above.

6. The small-array MEMS microphone apparatus as claimed in claim 1, wherein the first integrated circuit adds the first low-frequency acoustic signal, the first intermediate-frequency acoustic signal, and the first high-frequency acoustic signal to generate a first beam, and the first beam has the first directivity.

7. The small-array MEMS microphone apparatus as claimed in claim 1, wherein the first acoustic signal is input into the second integrated circuit, and the second integrated circuit performs a sampling delay on the first acoustic signal with the first clock signal, and subtracts the delayed first acoustic signal from the second acoustic signal to obtain a second differential acoustic signal, wherein the second differential acoustic signal has a second directivity that is different than the first directivity, wherein the second integrated circuit applies the low-pass filter and the first equalizer, the band-pass filter and the second equalizer, and the high-pass filter and the third equalizer respectively on the first sum acoustic signal, the first differential acoustic signal, and the second acoustic signal to obtain a second low-frequency acoustic signal, a second intermediate-frequency acoustic signal, and a second high-frequency acoustic signal, wherein the second integrated circuit adds the second low-frequency acoustic signal, the second intermediate-frequency acoustic signal, and the second high-frequency acoustic signal to generate a second beam, and the second beam has the second directivity.

8. A noise-suppression method, for use in a small-array MEMS (micro-electro mechanical system) microphone apparatus, wherein the small-array MEMS microphone apparatus comprises a microphone cover, a circuit board, a first microphone module, and a second microphone module, and the first microphone module comprises a first microphone and a first integrated circuit, and the second microphone module comprises a second microphone and a second integrated circuit, wherein the first microphone and the second microphone have the same sensitivity, phase, and omni-directivity, the method comprising:

capturing a first acoustic signal and a second acoustic signal from a sound source using the first microphone and the second microphone, respectively;

performing, by the first integrated circuit, a first logic operation on the first acoustic signal and the second acoustic signal to generate a first sum acoustic signal;

sample and delay the second acoustic signal with a first clock signal, and subtracting the delayed second acoustic signal from the first acoustic signal to obtain a first differential acoustic signal which has a first directivity; and bypassing and outputting, by the second integrated circuit, the second acoustic signal, wherein the second acoustic signal is omnidirectional.

9. The method as claimed in claim 8, wherein the first integrated circuit and the second integrated circuits are application-specific integrated circuits, and the first clock signal has a frequency of 2.048 MHz.

10. The method as claimed in claim 9, wherein a first distance between the first microphone and the second microphone is 5 mm.

11. The method as claimed in claim 10, further comprising:

applying, by the first integrated circuit, a low-pass filter and a first equalizer, a band-pass filter and a second equalizer, and a high-pass filter and a third equalizer respectively on the first sum acoustic signal, the first differential acoustic signal, and the second acoustic signal to obtain a first low-frequency acoustic signal, a first intermediate-frequency acoustic signal, and a first high-frequency acoustic signal, wherein the sensitivities of the first low-frequency acoustic signal, the first intermediate-frequency acoustic signal, and the first high-frequency acoustic signal are substantially the same.

12. The method as claimed in claim 11, wherein a first pass band of the low-pass filter is 200 Hz or less, a second pass band of the band-pass filter is from 200 Hz to 7400 Hz, and a third pass band of the high-pass filter is 7400 Hz or above.

13. The method as claimed in claim 11, further comprising:

adding, by the first integrated circuit, the first low-frequency acoustic signal, the first intermediate-frequency acoustic signal, and the first high-frequency acoustic signal to generate a first beam, wherein the first beam has the first directivity.

14. The method as claimed in claim 8, wherein the first acoustic signal is input into the second integrated circuit, and the method further comprises:

performing, by the second integrated circuit, a sampling delay on the first acoustic signal with the first clock signal, and subtracting the delayed first acoustic signal from the second acoustic signal to obtain a second differential acoustic signal, wherein the second differential acoustic signal has a second directivity that is different than the first directivity;

applying, by the second integrated circuit, the low-pass filter and the first equalizer on the first sum acoustic signal to obtain a second low-frequency acoustic signal, and applying the band-pass filter and the second equalizer on the first differential acoustic signal to obtain a second intermediate-frequency acoustic signal, and applying the high-pass filter and the third equalizer on the second acoustic signal to obtain a second high-frequency acoustic signal; and adding, by the second integrated circuit, the second low-frequency acoustic signal, the second intermediate-frequency acoustic signal, and the second high-frequency acoustic signal to generate a second beam, wherein the second beam has the second directivity.

15. A small-array MEMS (micro-electro mechanical system) microphone apparatus, comprising:

a microphone cover;

a circuit board coupled to the microphone cover, comprising a first acoustic hole, a second acoustic hole, and a third acoustic hole;

a first microphone module, comprising a first microphone and a first integrated circuit, wherein the first microphone captures a first acoustic signal from a sound source through the first acoustic hole;

a second microphone module, comprising a second microphone and a second integrated circuit, wherein the second microphone captures a second acoustic signal from the sound source through the second acoustic hole;

a third microphone module, comprising a third microphone and a third integrated circuit, wherein the third microphone captures a third acoustic signal from the sound source through the third acoustic hole, wherein the first microphone, the second microphone, and the third microphone have the same sensitivity, phase, and omni-directivity;

wherein the first acoustic signal is input into the second integrated circuit, and the second acoustic signal is input into the third integrated circuit, and the third acoustic signal is input into the first integrated circuit;

wherein the first integrated circuit performs a first logic operation on the first acoustic signal and the third acoustic signal to generate a first sum acoustic signal, performs sampling delay on the third acoustic signal with a first clock signal, and subtracts the delayed third acoustic signal from the first acoustic signal to obtain a first differential acoustic signal, wherein the first differential acoustic signal has a first directivity, wherein the first integrated circuit bypasses and outputs the first acoustic signal, and the first acoustic signal is omnidirectional, wherein the second integrated circuit performs a second logic operation on the second acoustic signal and the first acoustic signal to generate a first sum acoustic signal, and performs sampling delay on the first acoustic signal with the first clock signal, and subtracts the delayed first acoustic signal from the second acoustic signal to obtain a second differential acoustic signal, and the second differential acoustic signal has a second directivity, wherein the second integrated circuit bypasses and outputs the second acoustic signal, and the second acoustic signal is omnidirectional, wherein the third integrated circuit performs a third logic operation on the third acoustic signal and the second acoustic signal to generate a third sum acoustic signal, and performs a sampling delay on the second acoustic signal with the first clock signal, and subtracts the delayed second acoustic signal from the third acoustic signal to obtain a third differential acoustic signal, and the third differential acoustic signal has a third directivity, wherein the third integrated circuit bypasses and outputs the third acoustic signal, and the third acoustic signal is omnidirectional.

16. The small-array MEMS microphone apparatus as claimed in claim 15, wherein the first directivity is perpendicular to a first connection between the first microphone and the third microphone and toward far away from the small-array MEMS microphone apparatus, wherein the second directivity is perpendicular to a second connection between the first microphone and the second microphone and toward far away from the small-array MEMS microphone apparatus, wherein the third directivity is perpendicular to a third connection between the second microphone and the third microphone and toward far away from of the small-array MEMS microphone apparatus.

17. The small-array MEMS microphone apparatus as claimed in claim 16, wherein the first microphone, the second microphone, and the third microphone are arranged in an isosceles right triangle, and the first microphone and the second microphone are at a first distance, and the first microphone and the third microphone are at the first distance, and the second microphone and the third microphone are at the first distance multiplied by a square root of 2, wherein the first distance is 5 mm.

18. The small-array MEMS microphone apparatus as claimed in claim 16, wherein the first microphone, the second microphone, and the third microphone are arranged in an equilateral triangle, and there is a first distance between any two of the first microphone, the second microphone, and the third microphone, wherein the first distance is 5 mm.

* * * * *